United States Patent
Tanizaki et al.

(10) Patent No.: US 6,738,285 B2
(45) Date of Patent: May 18, 2004

(54) THIN FILM MAGNETIC MEMORY DEVICE WITH HIGH-ACCURACY DATA READ STRUCTURE HAVING A REDUCED NUMBER OF CIRCUIT ELEMENTS

(75) Inventors: Hiroaki Tanizaki, Hyogo (JP); Hideto Hidaka, Hyogo (JP); Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 120 days.

(21) Appl. No.: 10/190,668

(22) Filed: Jul. 9, 2002

(65) Prior Publication Data

US 2003/0142540 A1 Jul. 31, 2003

(30) Foreign Application Priority Data

Jan. 30, 2002 (JP) ..................... 2002-021127

(51) Int. Cl.$^7$ .............................. G11C 11/00
(52) U.S. Cl. ..................... 365/158; 365/171
(58) Field of Search ................. 365/158, 171

(56) References Cited

U.S. PATENT DOCUMENTS

| 6,205,073 B1 | 3/2001 | Naji ........................ 365/209 |
| 6,473,336 B1 * | 10/2002 | Nakajima et al. ........... 365/171 |
| 6,512,689 B1 * | 1/2003 | Naji et al. ................. 365/158 |

OTHER PUBLICATIONS

"A 10ns Read and Write Non–Volatile Memory Array Using a Magnetic Tunnel Junction and FET Switch in Each Cell", Scheuerlein et al., ISSCC Digest of Technical Papers, TA7.2, Feb. 2000, pp. 94–95, 128–129, 409–410.

"Nonvolatile RAM based on Magnetic Tunnel Junction Elements", Durlam et al., ISSCC Digest of Technical Papers, TA7.3, Feb. 2000, pp. 96–97, 130–131, 410–411.

"A 256kb 3.0V 1T1MTJ Nonvolatile Magnetoresistive RAM", Naji et al., ISSCC Digest of Technical Papers, TA7.6, Feb. 2001, pp. 94–95, 122–123, 404–405, 438.

* cited by examiner

Primary Examiner—Hoai Ho
Assistant Examiner—Tu-Tu Ho
(74) Attorney, Agent, or Firm—McDermott, Will & Emery

(57) ABSTRACT

In a data read operation, a selected memory cell and a reference memory cell are connected to complementary first and second data lines via complementary first and second bit lines, respectively. A differential amplifier supplies passing currents of the memory cell and the reference cell to complementary first and second data buses, and amplifies a passing current difference between the first and second data buses occurring corresponding to an electric resistance difference between the memory cell and reference cell to produce a voltage difference of a polarity corresponding to the level of the stored data of the selected memory cell between first and second nodes.

20 Claims, 17 Drawing Sheets

THIN FILM MAGNETIC MEMORY DEVICE WITH HIGH-ACCURACY DATA READ STRUCTURE HAVING A REDUCED NUMBER OF CIRCUIT ELEMENTS

BACKGROUND OF THE INVENTION

1. Field of the Invention

The present invention relates to a thin film magnetic memory device, and particularly to a thin film magnetic memory device provided with memory cells having MTJs (magnetic tunnel junctions)

2. Description of the Background Art

Attention is being given to an MRAM device as a memory device, which can nonvolatilely store data with low power consumption. The MRAM device is a memory device, in which a plurality of thin film magnetic members are formed in a semiconductor integrated circuit for nonvolatilely storing data, and random access to each thin film magnetic member is allowed.

Particularly, in recent years, it has been announced that a performance of the MRAM device can be dramatically improved by using the thin film magnetic members, which utilize the magnetic tunnel junctions, as memory cells. The MRAM device with memory cells having the magnetic tunnel junctions has been disclosed in technical references such as "A 10 ns Read and Write Non-Volatile Memory Array Using a Magnetic Tunnel Junction and FET Switch in Each Cell", ISSCC Digest of Technical Papers, TA7.2, February 2000, "Nonvolatile RAM based on Magnetic Tunnel Junction Elements", ISSCC Digest of Technical Papers, TA7.3, February 2000, and "A 256 kb 3.0V 1T1MTJ Nonvolatile Magnetoresistive RAM", ISSCC Digest of Technical Papers, TA7.6, February 2001.

FIG. 15 conceptually shows a structure of a memory cell, which has a magnetic tunneling junction, and may be merely referred to as an "MTJ memory cell" hereinafter.

Referring to FIG. 15, a MTJ memory cell includes a tunneling magneto-resistance element TMR having an electric resistance, which is variable in accordance with a data level of magnetically written storage data, and an access transistor ATR. Access transistor ATR is located between a bit line BL and a source line SRL, and is connected in series to tunneling magneto-resistance element TMR. Typically, access transistor ATR is formed of a field-effect transistor arranged on a semiconductor substrate.

For the MTJ memory cell, the device includes bit line BL and a digit line DL for carrying a data write current in different directions during a data write operation, respectively, a word line WL for instructing data reading, and source line SRL for puling down tunneling magneto-resistance element TMR to a ground voltage Vss during a data read operation. In the data read operation, tunneling magneto-resistance element TMR is electrically coupled between source line SRL carrying ground voltage Vss and bit line BL in response to turn-on of access transistor ATR.

FIG. 16 conceptually shows an operation of writing data in the MTJ memory cell.

Referring to FIG. 16, tunneling magneto-resistance element TMR has a ferromagnetic material layer FL, which has a fixed and uniform magnetization direction, and may be merely referred to as a "fixed magnetic layer" hereinafter, and a ferromagnetic material layer VL, which is magnetized in a direction depending on an externally applied magnetic field, and may be merely referred to as a "free magnetic layer" hereinafter. A tunneling barrier (tunneling film) TB formed of an insulator film is disposed between fixed magnetic layer FL and free magnetic layer VL. Free magnetic layer VL is magnetized in the same direction as fixed magnetic layer FL or in the opposite direction in accordance with the level of the storage data to be written. Fixed magnetic layer FL, tunneling barrier TB and free magnetic layer VL form a magnetic tunnel junction.

Tunneling magneto-resistance element TMR has an electric resistance, which is variable depending on a correlation in magnetization direction between fixed magnetic layer FL and free magnetic layer VL. More specifically, the electric resistance value of tunneling magneto-resistance element TMR takes a minimum value Rmin when the magnetization directions of fixed magnetic layer FL and free magnetic layer VL are parallel to each other. When the magnetization directions of them are opposite (anti-parallel) to each other, the above electric resistance value takes a maximum value Rmax.

In the data write operation, word line WL is inactive, and access transistor ATR is off. In this state, the data write currents for magnetizing free magnetic layer VL are supplied to bit line BL and digit line DL in directions depending on the level of write data, respectively.

FIG. 17 conceptually shows a relationship between the data write current and the magnetization direction of the tunneling magneto-resistance element in the data write operation.

Referring to FIG. 17, an abscissa H(EA) gives a magnetic field, which is applied in an easy axis (EA) to free magnetic layer VL of tunneling magneto-resistance element TMR. An ordinate H(HA) indicates a magnetic field acting in a hard axis (HA) on free magnetic layer VL. Magnetic fields H(EA) and H(HA) correspond to two magnetic fields produced by currents flowing through bit line BL and digit line DL, respectively.

In the MTJ memory cell, the fixed magnetization direction of fixed magnetic layer FL is parallel to the easy axis of free magnetic layer VL, and free magnetic layer VL is magnetized in the easy axis direction, and particularly in the same parallel direction, which is the same direction as fixed magnetic layer FL, or in the anti-parallel direction, which is opposite to the above direction, depending on the level ("1" or "0") of the storage data. The MTJ memory cell can selectively store data ("1" and "0") of one bit corresponding to the two magnetization directions of free magnetic layer VL.

The magnetization direction of free magnetic layer VL can be rewritten only when a sum of applied magnetic fields H(EA) and H(HA) falls within a region outside an asteroid characteristic line shown in FIG. 17. Therefore, the magnetization direction of free magnetic layer VL does not switch when the data write magnetic fields applied thereto have intensities corresponding to a region inside the asteroid characteristic line.

As can be seen from the asteroid characteristic line, the magnetization threshold required for switching the magnetization direction along the easy axis can be lowered by applying the magnetic field in the direction of the hard axis to free magnetic layer VL.

When the operation point in the data write operation is designed, for example, as shown in FIG. 17, the data write magnetic field in the MTJ cell selected as a data write target is designed such that the data write magnetic field in the direction of the easy axis has an intensity of $H_{WR}$. Thus, the data write current flowing through bit line BL or digit line DL is designed to take a value, which can provide the data write magnetic field of $H_{WR}$. In general, data write magnetic field $H_{WR}$ is represented by a sum of a switching magnetic field $H_{SW}$ required for switching the magnetization direction and a margin $\Delta H$. Thus, it is represented by an expression of $H_{WR}=H_{SW}+\Delta H$.

For rewriting the storage data of the MTJ memory cell, i.e., the magnetization direction of tunneling magneto-resistance element TMR, it is necessary to pass the data write currents at a predetermined level or higher through digit line DL and bit line BL. Thereby, free magnetic layer VL in tunneling magneto-resistance element TMR is magnetized in the parallel direction as fixed magnetic layer FL or anti-parallel direction in accordance with the direction of the data write magnetic field along the easy axis (EA). The magnetization direction, which was once written into tunneling magneto-resistance element TMR, and thus the storage data of MTJ memory cell is held nonvolatilely until next data writing is executed.

FIG. 18 conceptually shows an operation of reading data from the MTJ memory cell.

Referring to FIG. 18, access transistor ATR is turned on in response to activation of word line WL in the data read operation. Thereby, tunneling magneto-resistance element TMR is electrically coupled to bit line BL while being pulled down with ground voltage GND.

In this state, bit line BL is pulled up with a predetermined voltage, whereby a current path including bit line BL and tunneling magneto-resistance element TMR carries a memory cell current Icell corresponding to storage data of the MTJ memory cell. For example, this memory cell current Icell is compared with a predetermined reference current, whereby storage data can be read out from the MTJ memory cell.

As described above, the electric resistance of tunneling magneto-resistance element TMR is variable in accordance with the magnetization direction, which is rewritable by the data write magnetic field applied thereto. Therefore, nonvolatile data storage can be executed by establishing a correlation of electric resistances Rmax of Rmin of tunneling magneto-resistance element TMR with respect to levels ("1" and "0") of the storage data.

As described above, the MRAM device executes the data storage by utilizing a difference $\Delta R$ (=Rmax−Rmin) in junction resistance of tunneling magneto-resistance element TMR corresponding to a difference between storage data levels. Thus, the data read operation is executed based on the detection of passing current Icell of the selected memory cell.

For example, U.S. Pat. No. 6,205,073 B 1 (which will be merely referred to as a "prior art" hereinafter) has disclosed a structure for taking out a memory cell passing current by a current conveyor.

FIG. 19 is a circuit diagram showing a structure of a data read circuit according to the prior art.

Referring to FIG. 19, when data reading is to be performed, access transistor ATR in a selected memory cell 501 is turned on in accordance with activation of word line WL. Further, tunneling magneto-resistance element TMR (electric resistance Rmtj) of selected memory cell 501 is connected between a data readout line 503 and ground voltage Vss via a transistor switch 502, which is turned on by a column decoder.

The data read circuit according to the prior art includes current conveyors 505 and 510, which are arranged in two positions or stages with respect to data readout line 503, respectively.

Current conveyor 505 is arranged between data readout line 503 and a junction 508, and has a sense amplifier 506 and a transistor 507. Transistor 507 is connected between data readout line 503 and junction 508. Sense amplifier 506 amplifies a voltage difference between a predetermined bias voltage Vb1 and data readout line 503, and applies the amplified difference to a gate of transistor 507. Junction 508 is supplied with a constant current Is from a current source 509.

Current conveyor 510 is arranged between junction 508 and ground voltage Vss, and has a sense amplifier 511 and a transistor 512. Transistor 512 is connected between junction 508 and ground voltage Vss. Sense amplifier 511 amplifies a voltage difference between a predetermined bias voltage Vb2 and junction 508, and applies it to an output node 513. Output node 513 is connected to a gate of transistor 512.

By negative feedback operations, current conveyors 505 and 510 clamp the voltages on data readout line 503 and junction 508 at first and second bias voltages Vb1 and Vb2, respectively, and can produce a voltage Vo corresponding to passing current Icell of selected memory cell 501 on output node 513. Thus, passing current Icell of selected memory cell 501 can be detected while clamping a voltage applied to tunneling magneto-resistance element TMR at bias voltage Vb1, and thereby keeping stable electric resistance characteristics in tunneling magneto-resistance element TMR.

However, the data read circuit according to the prior art requires sense amplifiers 506 and 511, and a relatively large number of circuit elements are arranged in the circuit. Practically, the data reading is performed based on complementary comparing operations so that two data read circuit systems of the same structures are required, which further increases the number of circuit elements. Accordingly, variations in characteristics between circuit elements, which occur in a manufacturing process, may adversely affect data read accuracy.

Further, the circuit structure shown in FIG. 19 does not provide sufficiently high output voltage Vo on output node 513. Therefore, it is necessary to detect output voltage Vo with high accuracy.

Further, the negative feedback circuit causes unstable operations immediately after the power-on so that sense amplifiers 506 and 511 must be always supplied with operation currents. This increases a standby current of the data read circuit, and thus increases power consumption.

Further, output voltage Vo obtained on node No is affected by variations in resistance value (Rmtj) of tunneling magneto-resistance element TMR caused by variations in manufacturing of the MTJ memory cells. For increasing the accuracy of data reading, it is necessary to give consideration to a structure, which can compensate for lowering of the data read accuracy in accordance with variations caused in electric resistance characteristics of the MTJ memory cells due to variations in manufacturing process.

SUMMARY OF THE INVENTION

An object of the invention is to provide a structure of a thin film magnetic memory device, which can execute accurate data reading by a simple circuit structure.

In summary, a thin film magnetic memory device includes a plurality of memory cells, first and second data lines complementary to each other, and a differential amplifier portion. Each of the plurality of memory cells has an electric resistance according to magnetically written storage data. The differential amplifier portion performs data reading according to a difference between passing currents of the first and second data lines. In a data read operation, the first and second data lines are electrically coupled to a fixed voltage via a selected memory cell among the plurality of memory cells and a reference cell provided as a comparison target of the selected memory cell, respectively. The differential amplifier portion includes a current supply circuit arranged between a power supply voltage and first and second nodes for supplying the same operation current to the first and second nodes at least in the data read operation, and a current amplifier circuit for electrically coupling the first and second nodes to the first and second data lines, respectively, and converting a passing current difference occurring between the first and second data lines into a voltage difference between the first and second nodes so that each of the first and second data lines may be clamped at a predetermined voltage not exceeding a reference voltage.

Preferably, the differential amplifier portion further includes a current supply transistor electrically coupled between the power supply voltage and an internal node, and being turned on to supply the operation current in the data read operation. The current supply circuit has first and second transistors electrically coupled between the internal node and the first and second nodes, respectively, and each having a gate connected to the first node. The current amplifier circuit has a third transistor electrically coupled between the first node and the first data line with receiving the reference voltage on its gate, and a fourth transistor electrically coupled between the second node and the second data line with receiving the reference voltage on its gate.

According to a major advantage of the invention, therefore, the operation current of the differential amplifier portion is used as the passing currents of the selected memory cell and the reference cell so that the circuit elements of a data read circuit system can be reduced in number. Further, the passing current difference between the selected memory cell and the reference memory cell is amplified and converted into the voltage difference. Therefore, data reading can be performed with high accuracy.

Preferably, the current supply circuit has a first current mirror circuit for supplying the same current to the first and third nodes, and a second current mirror circuit for supplying the same current to the second and fourth nodes. The current amplifier circuit has a first converting circuit provided between the first and fourth node and the first data line, and for producing on the first node a voltage corresponding to the passing current of the first data line, and a second converting circuit provided between the second and third nodes and the second data line, and for producing on the second node a voltage corresponding to the passing current of the second data line.

According to the above structure, the differential amplifier portion formed of two complementary current mirror circuits can keep a balance between load capacities of the first and second nodes when performing differential amplification. Therefore, a data read time can be constant independently of the level of the read data. Further, a DC gain in the differential amplifying operation is large so that the data read operation can be stable.

According to another aspect of the invention, a thin film magnetic memory device includes a plurality of memory cells, a reference cell, a first data line and a data read circuit. Each of the plurality of memory cells has one of first and second electric resistances according to magnetically written storage data. The reference cell has an electric resistance intermediate between the first and second electric resistances, and is electrically coupled between first and second voltages at least in a data read operation. The first data line is electrically coupled between the first and second voltages via a selected memory cell corresponding to a selected address in the data read operation. The data read circuit is provided for performing data reading according to a difference between passing currents of the selected memory cell and the reference cell, and includes a data line voltage clamping portion. The data line voltage clamping portion clamps the first data line at a predetermined voltage based on the passing current of the reference cell in the data read operation.

The thin film magnetic memory device described above can clamp the voltage on the data line connected to the selected memory cell when executing the data read operation. Therefore, the data reading can be performed fast without charging and discharging the above data line having a relatively large parasitic capacity. Further, the clamping of the data line voltage can be performed based on the passing current of the reference cell, i.e., an actual electric resistance so that the data read accuracy can be ensured by following variations in electric resistance characteristics due to variations in manufacturing process.

Preferably, the data line voltage clamping portion clamps the first data line at the predetermined voltage prior to the data reading.

Even before the data reading, the data line is clamped at the predetermined voltage similar to that in the data read operation. Therefore, charging and discharging of the data line are not required even before the start of data reading. Consequently, the data read operation can be performed further fast.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings. In the figures, the same or corresponding portions bear the same reference numbers.
First Embodiment Referring to FIG. 1, an MRAM device 1 according to a first embodiment of the invention executes random access in response to a control signal CMD and an address signal ADD, which are externally applied, and executes input of write data DIN and output of read data DOUT.

MRAM device 1 includes a control circuit 5 for controlling a whole operation of MRAM device 1 in response to control signal CMD, and a memory array 10 having a plurality of MTJ memory cells arranged in rows and columns.

Figure 1:
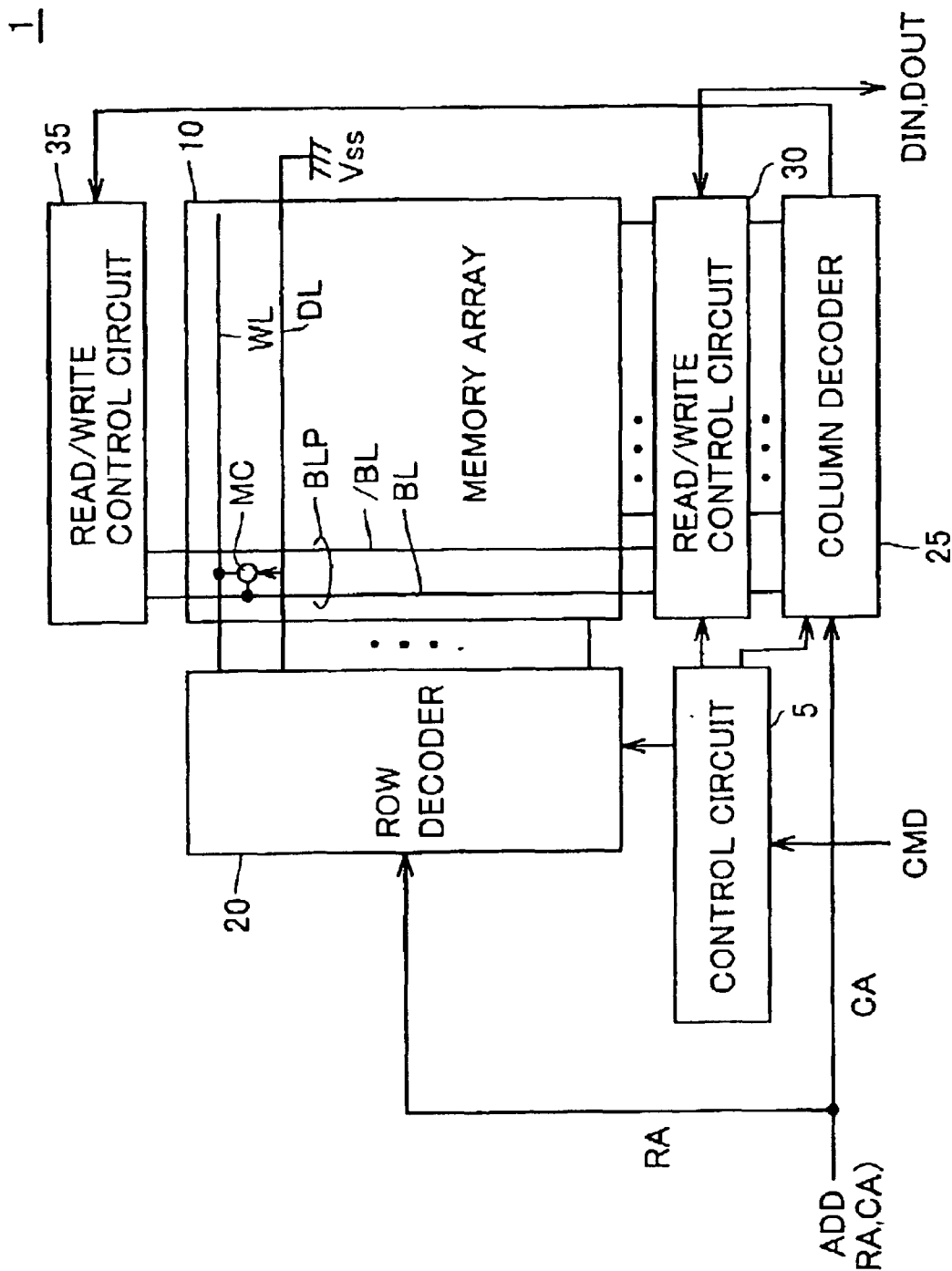
FIG. 1 is a schematic block diagram showing a whole structure of an MRAM device according to an embodiment of the invention.

In memory array 10, a word line WL and a digit line DL are arranged corresponding to each row of the MTJ memory cells, and a bit line pair BLP formed of complementary bit lines BL and /BL are arranged corresponding to each column of the MTJ memory cells. FIG. 1 representatively shows one MTJ memory cell MC as well as an arrangement of word line WL, digit line DL and bit line pair BLP provided for MTJ memory cell MC.

MRAM device 1 further includes a row decoder 20, which decodes a row address RA represented by an address signal to execute row selection in memory array 10, a column decoder 25, which decodes a column address CA represented by address signal ADD to execute column selection in memory array 10, and read/write control circuits 30 and 35.

Each of read/write control circuits 30 and 35 is formed of a collection of circuits for performing data writing on memory array 10 as well as a collection of circuits (which may also be referred to as a "data read circuit system" hereinafter) for reading data from memory array 10.

Digit line DL is coupled to ground voltage Vss in a region remote from row decoder 20 with memory array 10 therebetween.

Figure 2:
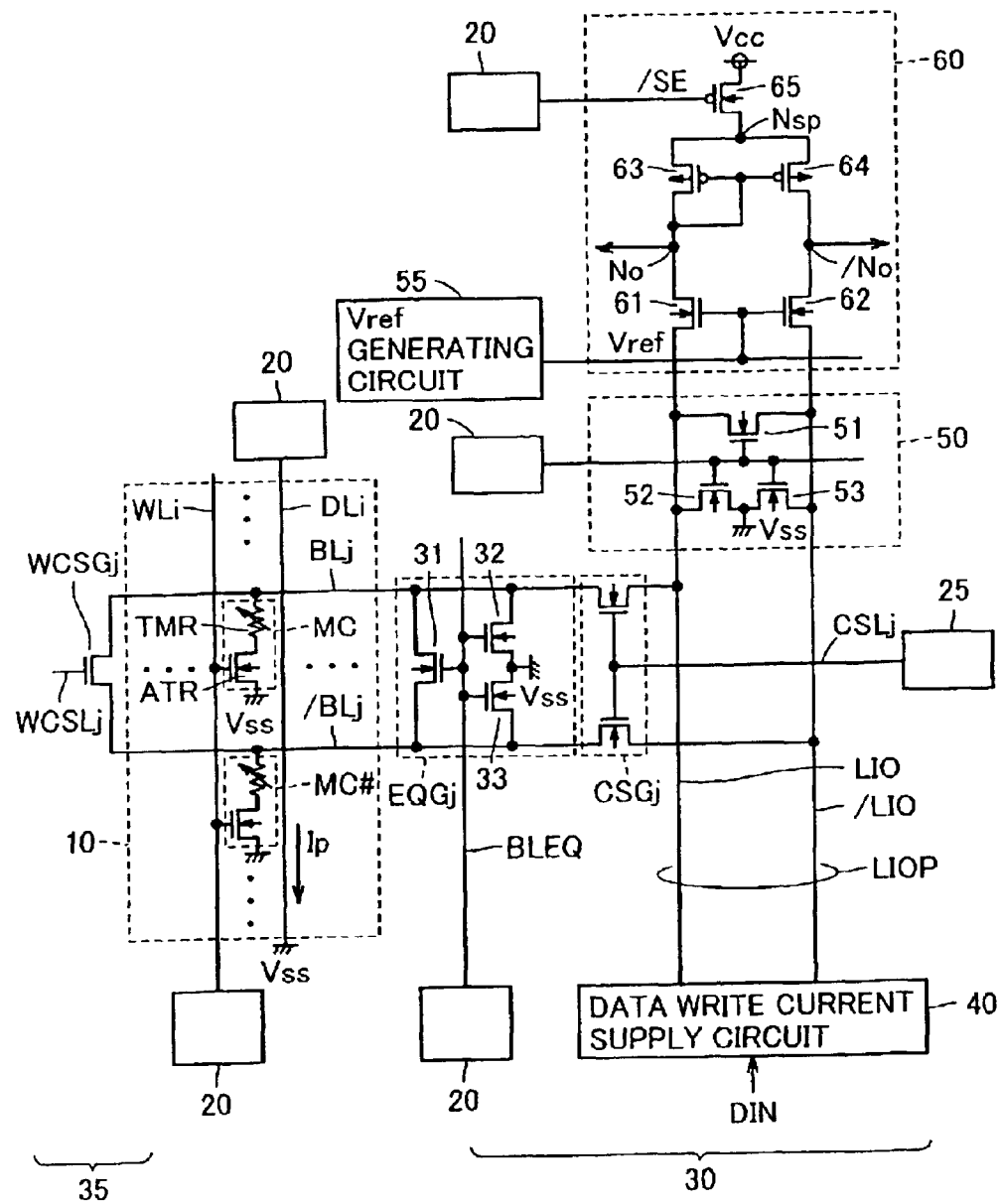
FIG. 2 is a circuit diagram showing structures of a memory array and a peripheral circuit according to the first embodiment.
Figure 15:
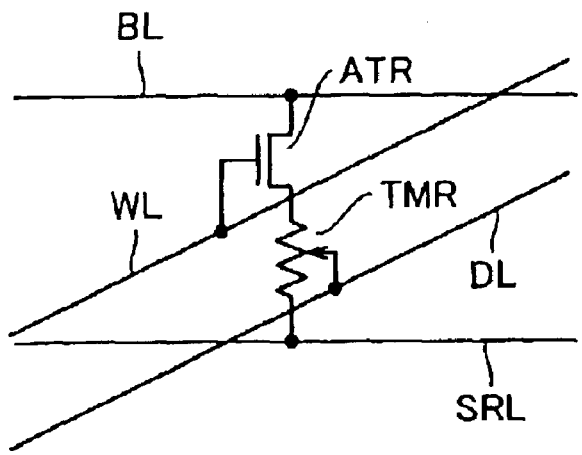
FIG. 15 conceptually shows a structure of a MTJ memory cell.
Figure 16:
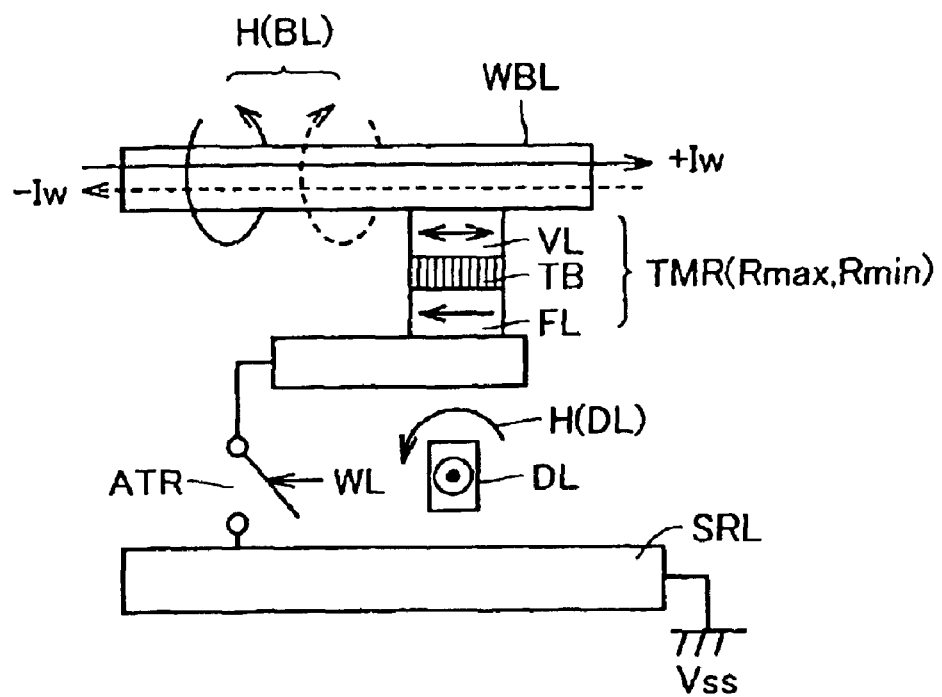
FIG. 16 conceptually shows an operation of writing data into the MTJ memory cell.
Figure 17:
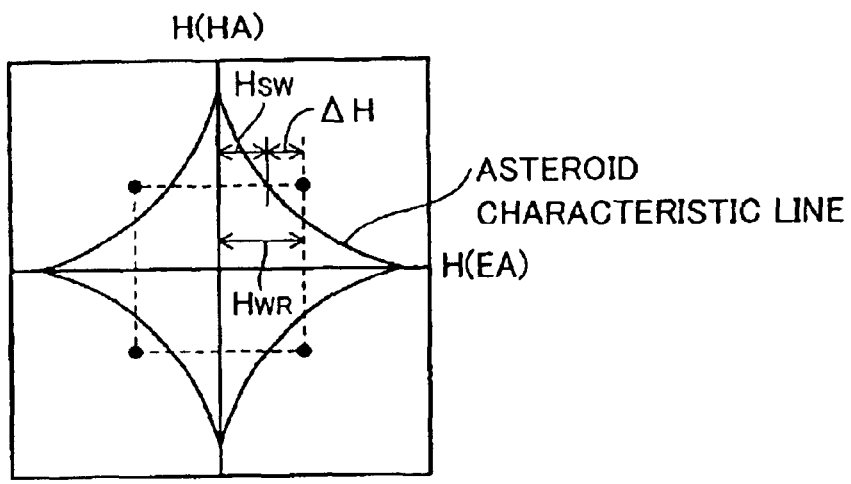
FIG. 17 conceptually shows a relationship between a data write current and a magnetization direction of a tunneling magneto-resistance element in the data write operation.
Figure 18:
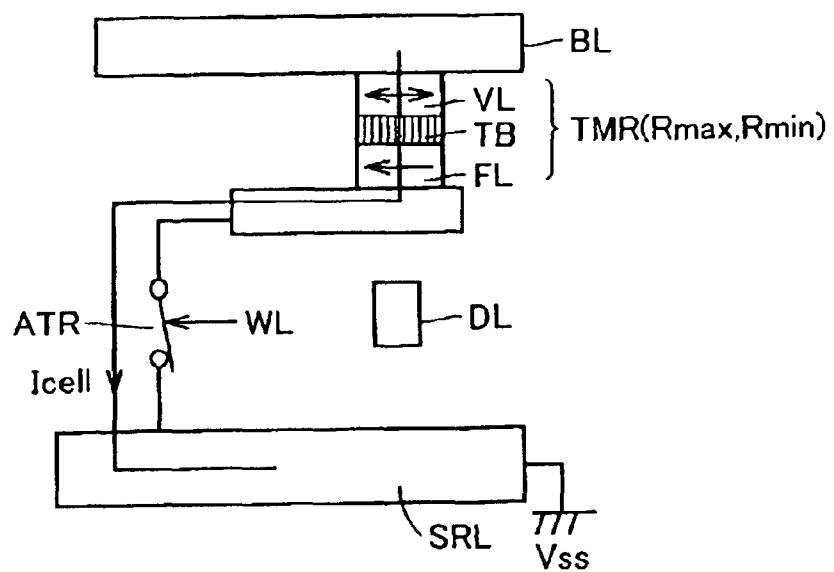
FIG. 18 conceptually shows an operation of reading data from the MTJ memory cell.
Figure 19:
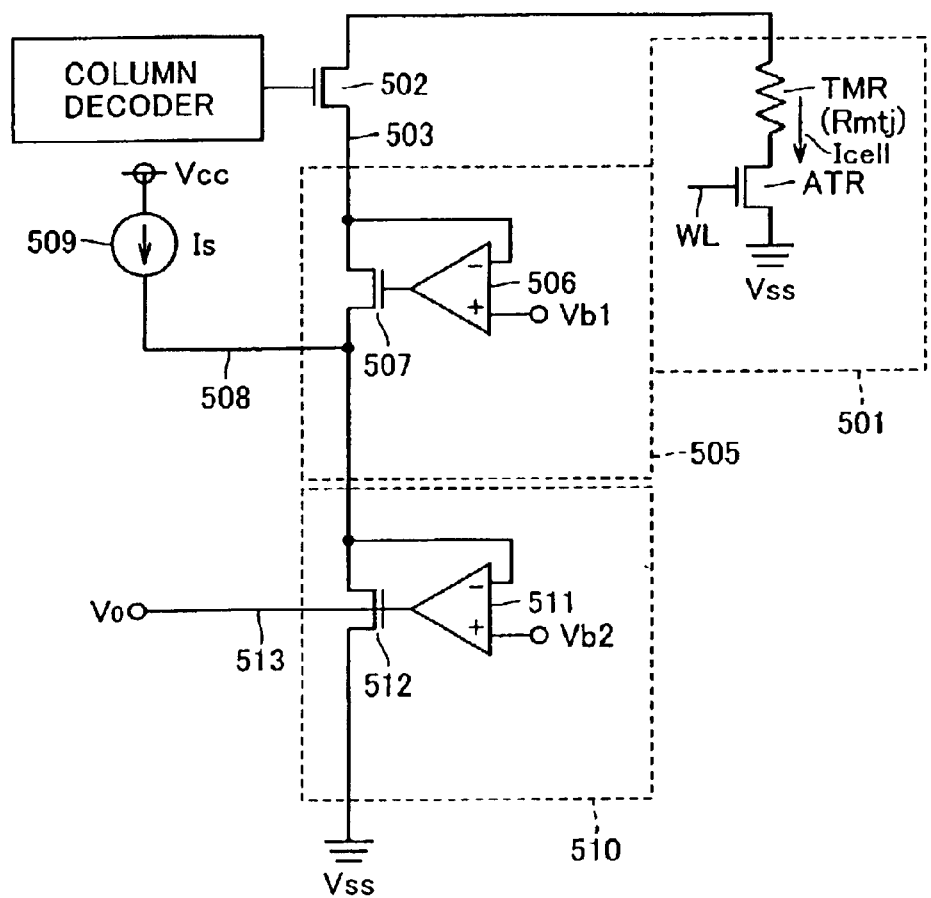
FIG. 19 is a circuit diagram showing a structure of a data read circuit in an MRAM device according to a prior art.

In the structure according to the first embodiment, as shown in FIG. 2, a MTJ memory cell is arranged at each of crossings of each memory cell row and paired bit lines BL and /BL. Thus, the two MTJ memory cells are arranged corresponding to one address indicated by a combination of the row and column addresses. Each of the MTJ memory cells has a structure similar to that shown in FIG. 15, and has a tunneling magneto-resistance element TMR and an access element (access transistor) ATR, which are connected in series between corresponding bit line BL or /BL and ground voltage Vss. Access transistor ATR has a gate connected to corresponding word line WL.

In the following description, one of the two MTJ memory cells corresponding to the same address, and particularly the memory cell connected to bit line BL may be merely referred to as a "memory cell MC", and the other connected to bit line /BL may be referred to as a "reference cell MC#". Memory cell MC and reference cell MC# corresponding to the same address perform the data storage of one bit. More specifically, data to be stored at the intended address is written into memory cell MC, and data complementary to that written into memory cell MC is written into reference cell MC#.

FIG. 2 representatively shows word line WLi, digit line DLi and bit lines BLi and /BLi corresponding to the memory cell row in an i-th (i: natural number) position and the memory cell column in a j-th (j: natural number) position as well as corresponding memory cell MC and reference cell MC#.

In the following description, binary voltage states, i.e., a high voltage state (e.g., power supply voltage Vcc) and a low voltage state (e.g., ground voltage Vss) of signals, signal lines, data and others may also be referred to as "H-level" and "L-level", respectively.

In each memory cell column, read/write control circuit 35 has a write column select gate WCSG arranged at ends on one side of bit lines BL and /BL. Write column select gate WCSG is turned on in response to activation (H-level) of corresponding write column select line WCSL. Write column select line WCSL is activated (H-level) in the selected column during data writing. FIG. 2 representatively shows write column select line WCSLj and write column select gate WCSGj arranged corresponding to bit lines BLj and /BLj.

At the vicinity of memory array 10, complementary data lines LIO and /LIO are arranged for conveying or transmitting the read data and the write data. Data lines LIO and /LIO form a data line pair LIOP.

In each memory cell column, a column select gate CSG is arranged between the ends on the other side of bit lines BL and /BL and data lines LIO and /LIO. Column select gate CSG is turned on in response to activation (H-level) of corresponding column select line CSL. Column select line CSL in the selected column is activated (H-level) in both the data write operation and the data read operation. FIG. 2 representatively shows column select line CSLj and column select gate CSGj provided corresponding to bit lines BLj and /BLj.

Description will now be given on an operation of writing data into the MTJ memory cell. In the following example, the i-th row and j-th column are selected as the data write target.

In the data write operation, row decoder 20 couples digit line DLi in the selected row to power supply voltage Vcc for activation. Digit line DLi thus activated is connected at its opposite ends to power supply voltage Vcc and ground voltage Vss, respectively. Therefore, active digit line DLi can carry data write current Ip in the row direction. Data write current Ip in the row direction is constant regardless of the level of the write data.

Further, row decoder 20 fixes digit lines DL in the unselected rows to ground voltage Vss. Therefore, data write current Ip in the row direction does not flow through the unselected digit lines DL.

Read/write control circuit 30 further includes a data write current supply circuit 40. Data write current supply circuit 40 sets data lines LIO and /LIO to power supply voltage Vcc (H-level) and ground voltage Vss (L-level), or vice versa in accordance with write data DIN, respectively. For example, if write data DIN is equal to "1", data write current supply circuit 40 sets data lines LIO and /LIO to H- and L-levels, respectively. If write data DIN is equal to "0", data write current supply circuit 40 sets data lines LIO and /LIO to L- and H-levels, respectively.

Thereby, bit lines BLj and /BLj, which are in the selected column and are connected together at ends on the one side by write column select gate WCSGj, can carry currents in the opposite directions according to the level of write data DIN. Consequently, write data DIN and complementary data can be written in parallel into memory cell MC and reference cell MC# at the selected address.

Description will now be given on an operation of reading data from the MTJ memory cell.

Read/write control circuit 30 has equalize circuits EQG arranged for the memory cell columns, respectively. FIG. 2 representatively shows equalize circuit EQGj corresponding to the memory cell column in the j-th position.

Equalize circuit EQGj has a transistor switch 31 connected between corresponding bit lines BLj and /BLj, a transistor switch 32 connected between bit line BLj and ground voltage Vss, and a transistor switch 33 connected between bit line /BLj and ground voltage Vss. Each of transistor switches 31, 32 and 33 is formed of, e.g., an N-channel MOS transistor.

Each of transistor switches 31, 32 and 33 receives on its gate a bit line equalize signal BLEQ, which is produced by row decoder 20 for common use in the memory cell columns of memory array 10. Bit line equalize signal BLEQ is activated to attain H-level at least during a predetermined period before the data read operation.

Although not shown, the equalize circuits provided for the other memory cell columns have similar structures, and are responsive to bit line equalize signal BLEQ. In response to the activation of bit line equalize signal BLEQ, the precharge/equalize operation is performed so that each of bit lines BL and /BL in each memory cell column is set to ground voltage Vss.

Read/write control circuit 30 further has a data line equalize circuit 50 for equalizing data line pair LIOP and a differential amplifier 60.

Data line equalize circuit 50 has a transistor switch 51 connected between data lines LIO and /LIO, a transistor switch 52 connected between data line LIO and ground voltage Vss, and a transistor switch 53 connected between data line /LIO and ground voltage Vss. Each of transistor switches 51, 52 and 53 is formed of, e.g., an N-channel MOS transistor.

Each of transistor switches 51, 52 and 53 receives on its gate a data line equalize signal LIOEQ produced by row decoder 20. Data line equalize signal LIOEQ is activated to attain H-level at least for a predetermined period before the data read operation. By the precharge/equalize operation in response to this activation, each of data lines LIO and /LIO is set to ground voltage Vss.

Differential amplifier 60 has an N-channel MOS transistor 61 connected between a node No and data line LIO, an N-channel MOS transistor 62 connected between a node /No and data line /LIO, a P-channel MOS transistor 63 connected between nodes Nsp and No, a P-channel MOS transistor 64 connected between nodes Nsp and /No, and a P-channel MOS transistor 65 connected between power supply voltage Vcc and node Nsp.

Each of gates of transistors 63 and 64 is connected to node No. Transistors 63 and 64 form a current mirror circuit, and tend to supply the same current to nodes No and /No.

Each of gates of transistors 61 and 62 is supplied with a fixed reference voltage Vref produced by a Vref generating circuit 55. Transistors 61 and 62 maintain local data lines LIO and ILIO at or below the reference voltage Vref, and amplify a difference between passing currents of data lines LIO and /LIO to convert it into a voltage difference between nodes No and /No.

Transistor 65 receives on its gate a sense enable signal /SE, which is activated to attain L-level by row decoder 20 in the data read operation. Transistor 65 supplies an operation current to operate differential amplifier 60 in response to activation (L-level) of sense enable signal /SE.

Figure 3:
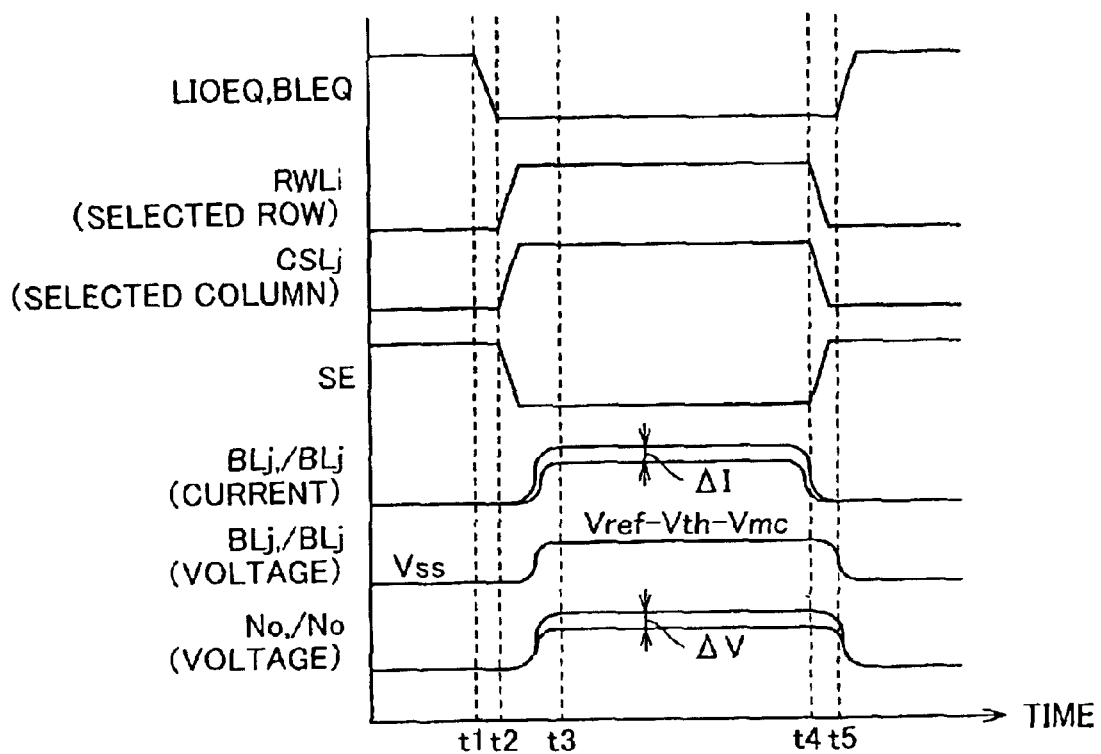
FIG. 3 is an operation waveform diagram representing a data read operation in an MRAM device according to the first embodiment.

Referring to FIG. 3, description will now be given on the data read operation in the MRAM device according to the first embodiment. FIG. 3 represents by way of example the operation in the case where the i-th row and the j-th column are selected as the data read target.

Referring to FIG. 3, data line equalize signal LIOEQ and bit line equalize signal BLEQ are active and at H-level before a time t1 of start of the data read operation. Thereby, bit lines BL and /BL in each memory cell column are precharged to ground voltage Vss, and data lines LIO and /LIO are precharged to ground voltage Vss.

When the data read operation starts at time t1, data line equalize signal LIOEQ and bit line equalize signal BLEQ are first inactivated to attain L-level so that each of bit lines BL and /BL and data lines LIO and /LIO is disconnected from ground voltage Vss. Thereby, preparations for starting the data reading are completed.

At a time t2, sense enable signal /SE is activated to attain L-level so that differential amplifier 60 starts the operation. Thereby, current supply to each of data lines LIO and /LIO starts. In accordance with the same timing as the above, each of word line WLi in the selected row and column select line CSLj in the selected column are activated to attain H-level.

In response to the activation of word line WLi in the selected row and column select line CSLj in the selected column, data line LIO is pulled down to ground voltage Vss through bit line BLj and memory cell MC, and data line /LIO is pulled down to ground voltage Vss through bit line /BLj and reference cell MC#. As already described, complementary data are stored in memory cell MC and reference cell MC#, and therefore memory cell MC and reference cell MC# have one and the other of electric resistances Rmax and Rmin, respectively.

In response to the activation of sense enable signal /SE, transistor 65 supplies the operation current, which flows to ground voltage Vss through data lines LIO and /LIO, bit lines BLj and /BLj, and tunneling magneto-resistance elements TMR of memory cell MC and reference cell MC#.

In differential amplifier 60, the current mirror circuit formed of transistors 63 and 64 tends to supply the same current to data lines LIO and /LIO. However, an electric resistance difference ΔR is present between memory cell MC and reference cell MC# corresponding to the selected address so that a current difference tends to occur between the passing currents of them. This current difference tends to cause a voltage difference between bit lines BLj and /BLj, and thus between data lines LIO and ILIO. This voltage difference corresponds to a difference in source-drain voltage between transistors 61 and 62 in differential amplifier 60 so that the electric resistance difference ΔR is converted into a difference ΔI in passing current (source-drain current) between transistors 61 and 62. Thus, current difference ΔI appears as the current difference between bit lines BLj and /BLj, and between data lines LIO and /LIO. Transistors 61 and 62 cause a voltage difference ΔV, which is produced by amplifying current difference ΔI, between nodes No and /No. The polarity of voltage difference ΔV, i.e., a relative magnitude in voltage-between nodes No and /No depends on the storage data of selected memory cell MC.

A voltage difference does not occur between bit lines BLj and /BLj, and between data lines LIO and /LIO, and each of voltages on data lines LIO and /LIO as well as bit lines BLj and /BLj are stably kept at "Vref−Vth−Vmc", where Vth corresponds to a threshold voltage of transistors 61 and 62, and Vmc corresponds to a voltage drop caused in memory cell MC and reference cell MC#.

Reference voltage Vref is determined in view of reliability of an insulating film, which is a tunneling barrier in the tunneling magneto-resistance element, so that the foregoing voltage "Vref−Vth−Vmc" is equal to, e.g., about 400 [mV]. This avoids breakdown of the memory cell due to application of an excessive voltage to the tunneling barrier, and can improve operation reliability.

In accordance with the polarity of voltage difference ΔV between nodes No and /No, the storage data can be read out from the selected address. For example, an amplifier for amplifying the voltage difference between nodes No and /No may be arranged in a downstream stage, whereby read data DOUT read from memory array 10 can be produced.

When the data reading ends, sense enable signal /SE, word line WLi in the selected row and column select line CSLj in the selected column are inactivated at a time t4. At a time t5, data line equalize signal LIOEQ and bit line equalize signal BLEQ are activated to attain H-level, and each of bit lines BL and /BL and data lines LIO and /LIO is precharged so that the circuit state before the data reading is restored.

According to the structure of the first embodiment, as already described, the operation current of differential amplifier 60 is used as the passing current of the memory cell so that the circuit elements in the data read circuit system can be reduced in number. Further, current difference ΔI caused by electric resistance difference ΔR is converted into voltage difference ΔV by the amplification of the transistors. Therefore, accurate data reading can be performed.

Further, the voltage applied to tunneling magneto-resistance element TMR is kept constant in the data read operation. Therefore, variations in electric resistance characteristics of the tunneling magneto-resistance element are suppressed, and accurate data reading can be performed.

Second Embodiment

Figure 4:
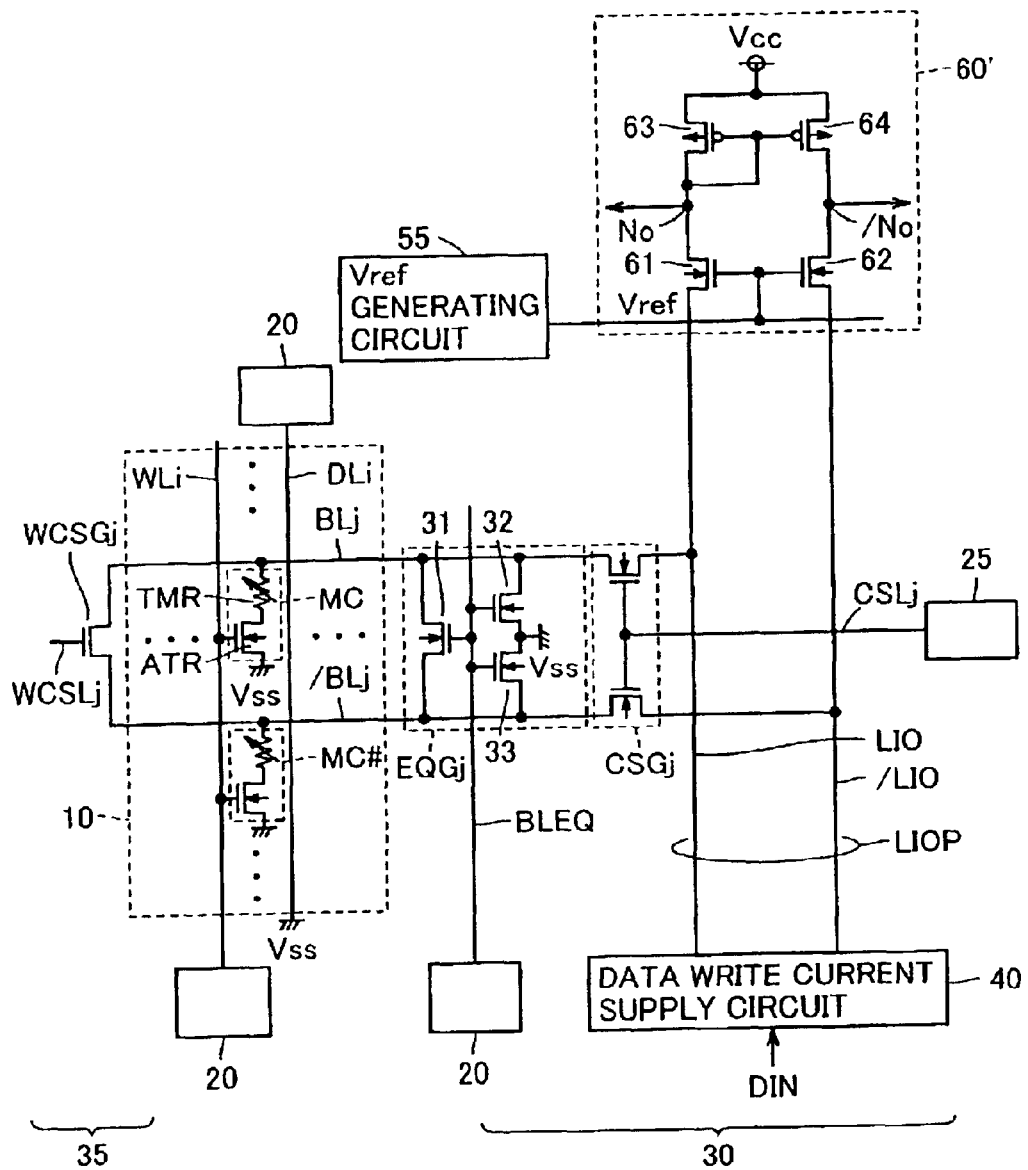
FIG. 4 is a circuit diagram showing structures of a memory array and a peripheral circuit according to a second embodiment.

Referring to FIG. 4, a structure according to a second embodiment differs from the structure shown in FIG. 2 in that a differential amplifier 60' is employed instead of differential amplifier 60, and data line equalize circuit 50 is not employed.

Differential amplifier 60' differs from differential amplifier 60 shown in FIG. 2 in that P-channel MOS transistor 65 serving as a current source is not employed. In differential amplifier 60', sources of P-channel MOS transistors 63 and 64 are always coupled electrically to power supply voltage Vcc.

Structures other than the above of the MRAM device according to the second embodiment are the same as those of the first embodiment, and therefore description thereof is not repeated.

Figure 5:
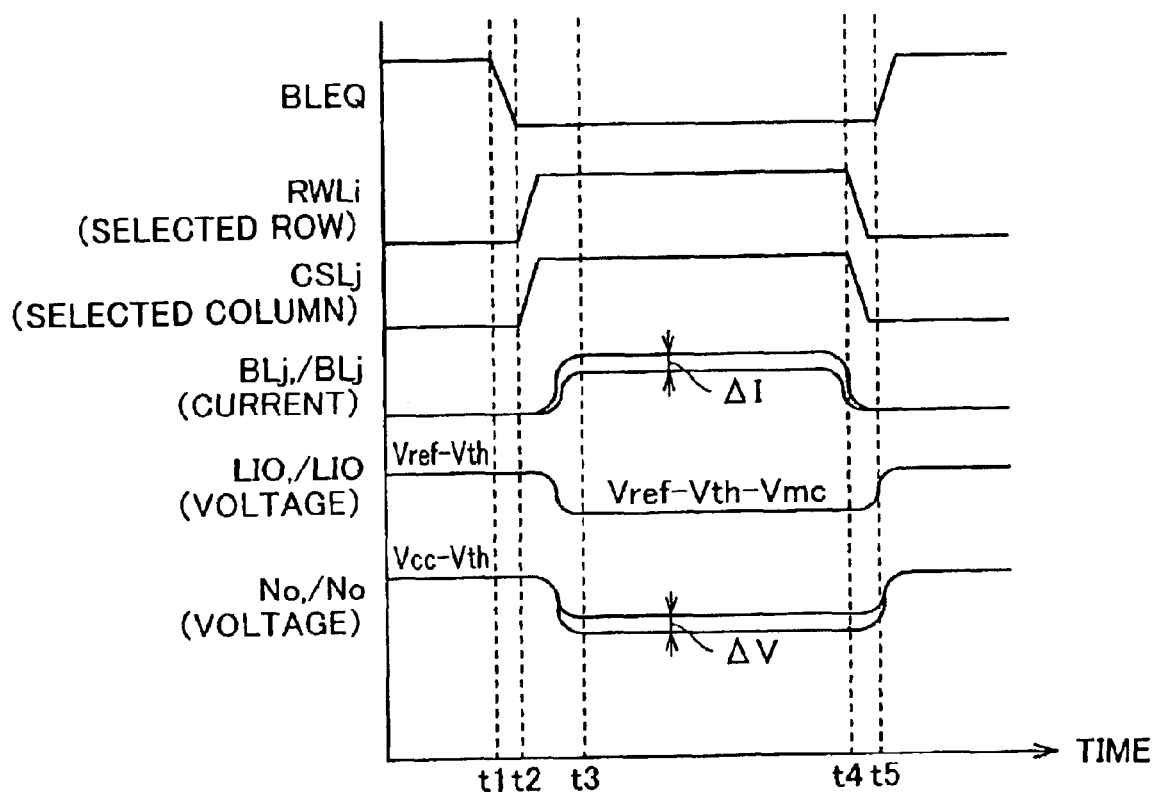
FIG. 5 is an operation waveform diagram showing a data read operation in an MRAM device according to the second embodiment.

Referring to FIG. 5, description will now be given, on the data read operation in the MRAM device according to the second embodiment. FIG. 5 likewise represents an operation in the case where the i-th row and the j-th column are selected as the data read target.

Referring to FIG. 5, bit line equalize signal BLEQ is activated to attain H-level before the data reading starts at time t1. Therefore, bit lines BL and /BL in each memory cell column are precharged to ground voltage Vss.

Since differential amplifier 60' is always supplied with the operation current even before the data reading, each of data lines LIO and /LIO is clamped at "Vref−Vth" corresponding to reference voltage Vref. Likewise, each of voltages on nodes No and /No is fixed to "Vcc−Vth".

At time t2, when word line WLi in the selected row and column select line CSLj in the selected column are activated to attain H-level, current difference ΔI, which is similar to that in the first embodiment and corresponds to electric resistance difference ΔR between memory cell MC and reference cell MC# at the selected address, occurs between bit lines BLj and /BLj, and between data lines LIO and /LIO. This current difference ΔI is converted into voltage difference ΔV between nodes No and /No, similarly to the first embodiment.

However, a voltage difference does not occur between bit lines BLj and /BLj, and between data lines LIO and /LIO, and each of voltages on these lines is stably kept at "Vref−Vth−Vmc" similarly to those shown in FIG. 3.

In the structure according to the second embodiment, as described above, the circuit structure of the differential amplifier forming the data read circuit system can be further simplified, and accurate data reading can be performed similarly to the first embodiment. Further, it is possible to reduce the voltage variations occurring before and after the data reading on data lines LIO and /LIO, which have relatively large parasitic capacities, so that the data read operation can be performed fast.

Third Embodiment

In a third embodiment, memory array 10 is divided into a plurality of predetermined units, each of which is provided with the data read circuit system according to the first or second embodiment.

Figure 6:
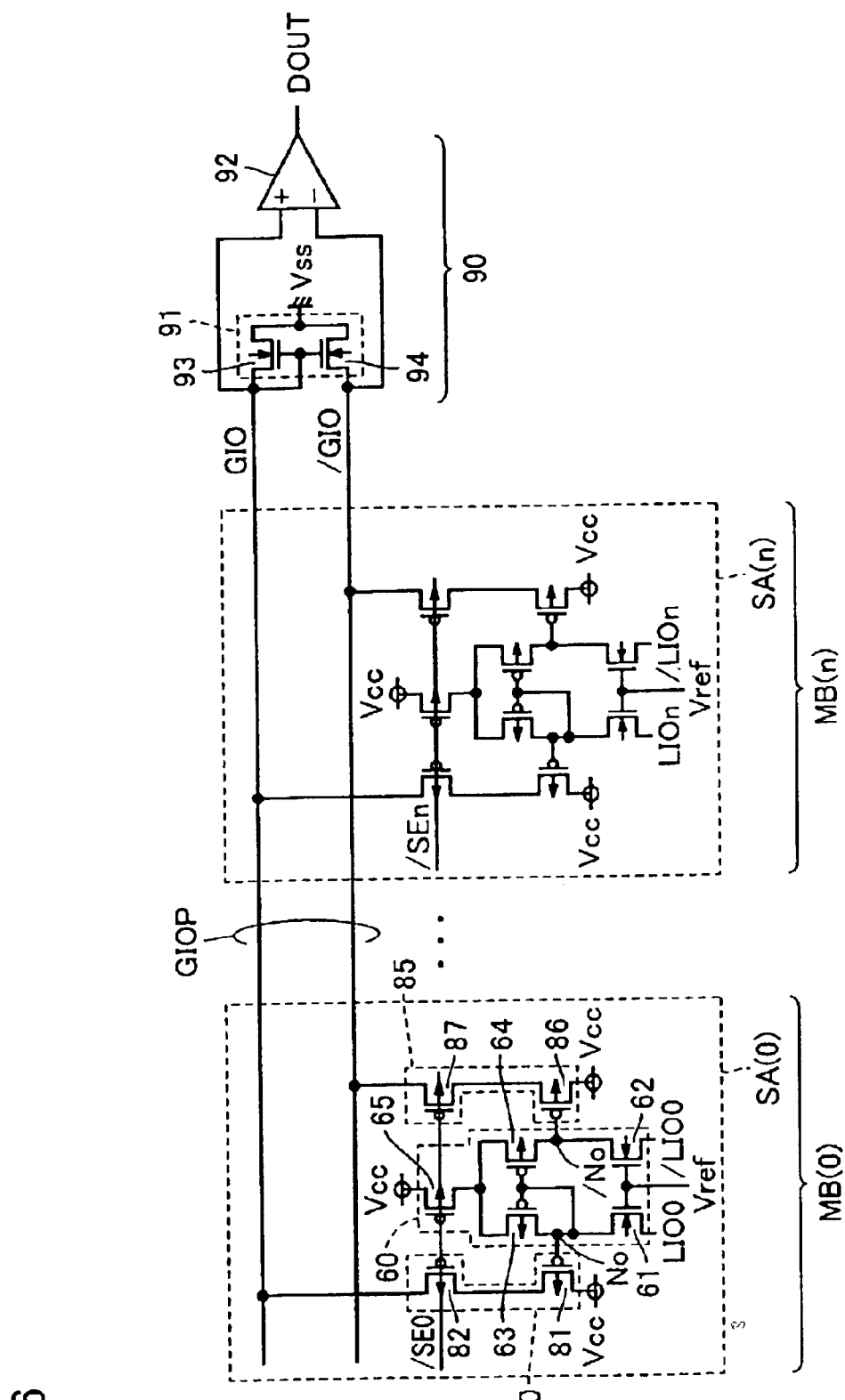
FIG. 6 is a circuit diagram showing a structure of a data read circuit system according to a third embodiment.

In the structure of the third embodiment shown in FIG. 6, memory array 10 is divided into memory blocks MB(0)–MB(n) of (n+1) in number (n: natural number). Data lines LIO0 and /LIO0–LIOn and /LIOn are arranged in memory blocks MB(0)–MB(n), respectively. Sense amplifiers SA(0)–SA(n) operate to read data from memory blocks MB(0)–MB(n), respectively.

In the following description, memory blocks MB(0)–MB(n) may be collectively and simply referred to as "memory blocks MB" hereinafter, and sense amplifiers SA(0)–SA(n) may be collectively and simply referred to as "sense amplifiers SA" hereinafter. Likewise, data lines LIO0–LIOn may be collectively and simply referred to as "data lines LIO", and data lines /LIO0–/LIOn may be collectively and simply referred to as "data lines /LIO".

Complementary global data lines GIO and /GIO as well as a main amplifier 90 are arranged in common to main blocks MB(0)–MB(n). Global data lines GIO and /GIO form a global data line pair GIOP.

Main amplifier 90 includes a current mirror circuit 91 for supplying the same current to global data lines GIO and /GIO, and a differential amplifier 92 for amplifying the voltage difference between global data lines GIO and /GIO to produce read data DOUT.

Current mirror circuit 91 has transistors 93 and 94, which are connected between ground voltage Vss and global data lines GIO and /GIO, respectively. Transistors 93 and 94 are formed of N-channel MOS transistors, respectively. Each of transistors 93 and 94 has a gate connected to global data line GIO.

Each sense amplifier SA reads data of one bit from corresponding memory block MB. Description will now be representatively given on the structure of sense amplifier SA(0).

Sense amplifier SA(0) includes data transmitting circuits 80 and 85 in addition to differential amplifier 60 shown in FIG. 2.

Data transmitting circuit 80 has transistors 81 and 82 connected in series between power supply voltage Vcc and global data line GIO. Similarly, data transmitting circuit 85 has transistors 86 and 87 connected in series between power supply voltage Vcc and global data line /GIO. Transistors 81 and 86 have gates connected to nodes No and /No of differential amplifier 60, respectively. Transistors 82 and 87 receive sense enable signal /SE0 on their gates similarly to transistor 65 in differential amplifier 60.

Sense enable signals /SE0–/SEn are provided corresponding to memory blocks MB(0)–MB(n), respectively. Sense enable signals /SE0–/SEn are activated to attain L-level when the corresponding memory block is selected as the data read target. For example, when memory block MB(0) is selected as a data read target, only sense enable signal /SE0 is activated to attain L-level, and other sense enable signals /SE1–/SEn are inactive and at H-level.

Data transmitting circuit 80 responds to the activation of sense enable signal /SE0, and thereby drives global data line GIO with a current (source-drain current of transistor 86) corresponding to the voltage on node No. Similarly, data transmitting circuit 85 responds to the activation of sense enable signal /SE0, and thereby drives global data line /GIO with a current (source-drain current of transistor 81) corresponding to the voltage on node /No.

As described above, data transmitting circuits 80 and 85 drive global data lines GIO and /GIO to power supply voltage Vcc, respectively. Therefore, each of transistors 81, 82, 86 and 87 is preferably formed of a P-channel MOS transistor.

As already described, differential amplifier 60 in sense amplifier SA(0) produces voltage difference ΔV between nodes No and /No in accordance with the data read from the selected address in corresponding memory block MB0. Data transmitting circuits 80 and 85 convert voltage difference ΔV into a passing current difference between global data lines GIO and /GIO, and transmit it to global data lines GIO and /GIO.

As described above, the differential amplifier, which is formed of data transmitting circuits 80 and 85 as well as current mirror circuit 91, amplifies voltage difference ΔV between nodes No and /No in memory block MB(0) to produce the voltage difference between global data lines GIO and /GIO, and differential amplifier 92 further amplifies it to produce read data DOUT. Sense amplifiers SA provided for the other memory blocks have the structures similar to that of sense amplifier SA(0).

Owing to the above structure, the voltage difference corresponding to the data read from selected memory block MB can be produced between global data lines GIO and /GIO. Consequently, the reading of data from memory block MB selected as the data read target can be performed by global data line pair GIOP and main amplifier 90, which are shared by memory blocks MB(0)–MB(n).

According to the structure of the third embodiment, the reading of data from the MRAM device is executed by the differential amplification operations performed in two stages by differential amplifier 60, which supplies the passing current to the selected memory cell, and by data transmitting circuits 80 and 85 as well as main amplifier 90 amplifying the voltages on global data line pair GIOP. As described above, global data lines GIO and /GIO are disconnected from the passing current path of selected memory cell MC and corresponding reference cell MC#. Thereby, the data reading can be performed fast although the structure uses global data lines GIO and /GIO, of which parasitic capacities increase in accordance with increase in array capacity.

Sense enable signals /SE0–/SEn include an instruction (corresponding to sense enable signal /SE in the first and second embodiments) relating to the timing of data read operation as well as information for selecting memory blocks MB(0)–MB(n). Therefore, the signal interconnections can be reduced in number as compared with the case where signals for the above instruction are provided independently of signals for the above information.

First Modification of Third Embodiment

Figure 7:
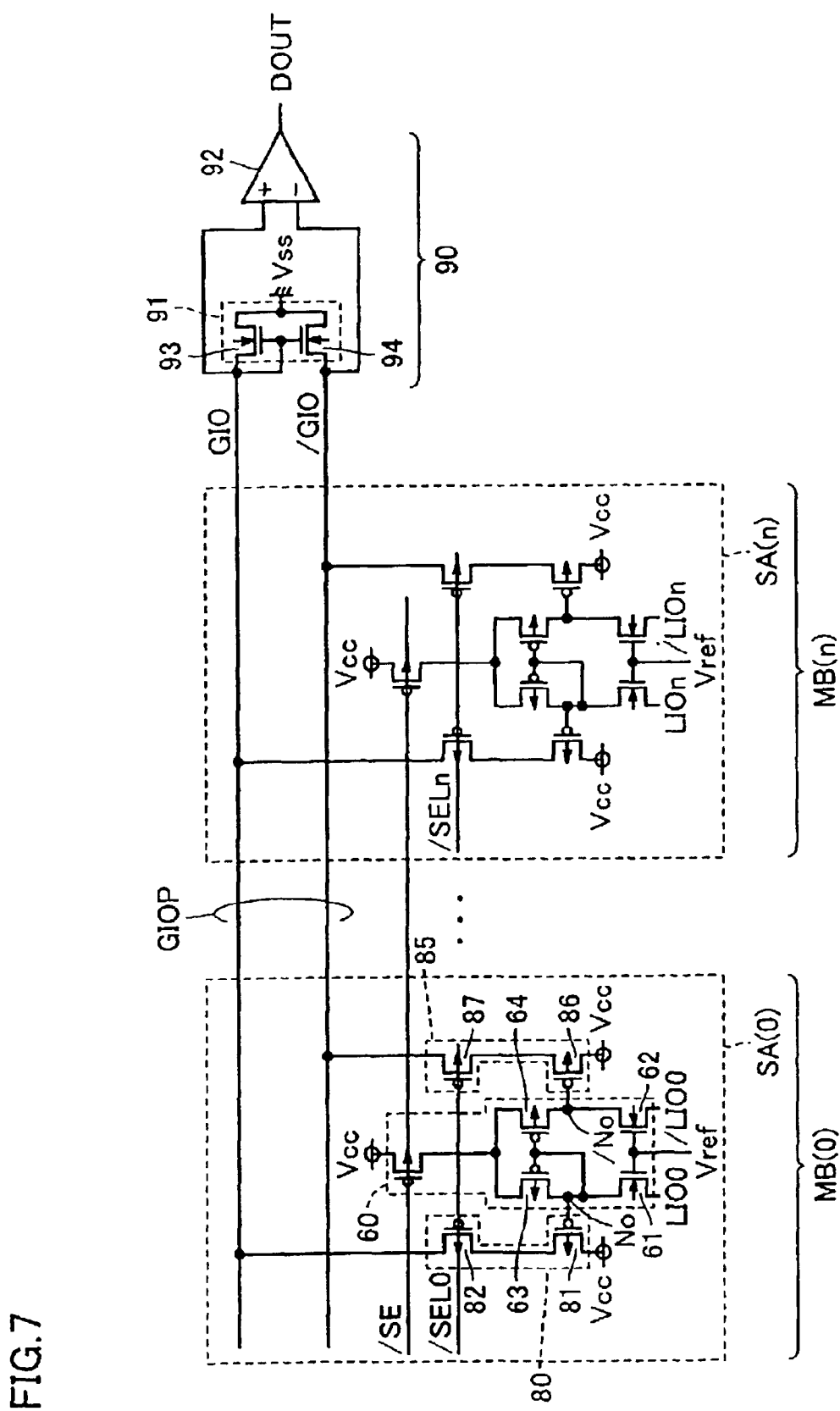
FIG. 7 is a circuit diagram showing a structure of a data read circuit system according to a first modification of the third embodiment.

Referring to FIG. 7, a structure according to a first modification of the third embodiment differs from the structure of the third embodiment in that sense enable signal /SE is independent of block select signals /SEL0–/SELn.

Similarly to the first and second embodiments, sense enable signal /SE is activated to attain L-level during data reading (between times t2 and t5 in FIG. 3), and is supplied as a signal common to memory blocks MB(0)–MB(n) to each of sense amplifiers SA(0)–SA(n).

Block select signals /SEL0–/SELn are provided corresponding to memory blocks MB(0)–MB(n), respectively, and each are activated to attain L-level when corresponding memory block MB is activated in accordance with the address information.

In each sense amplifier SA, transistor 65 in differential amplifier 60 receives sense enable signal /SE on its gate. Transistors 82 and 87 of data transmitting circuits 80 and 85 receive corresponding one of block select signals /SEL0–/SELn on their gates. For example, transistors 82 and 87 in sense amplifier SA(0) receive block select signal /SEL0 on their gates. Structures and operations other than the above are substantially the same as those in the third embodiment, and therefore, description thereof is not repeated.

In the data read operation, therefore, the data reading is performed in parallel in memory blocks MB(0)–MB(n) in response to the activation of sense enable signal /SE. Thereby, a sufficient voltage difference occurs between nodes No and /No of differential amplifier 60 in each of sense amplifiers SA(0)–SA(n). Thereby, block select signals /SEL0–/SELn are successively activated in sense amplifiers SA(0)–SA(n) in accordance with the timing of occurrence of the sufficient voltage difference between nodes No and /No of differential amplifier 60 so that memory blocks MB(0)–MB(n) are successively selected. Thereby, the voltage difference corresponding to the data read from the selected memory block is produced between global data lines GIO and /GIO similarly to the data reading in the third embodiment, and thereby read data DOUT can be produced.

As a result, the data of (n+1) bits read from respective memory blocks MB(0)–MB(n) can be continuously read fast. Thus, the MRAM device can have a structure suitable to the burst operation.

Second Modification of Third Embodiment

Figure 8:
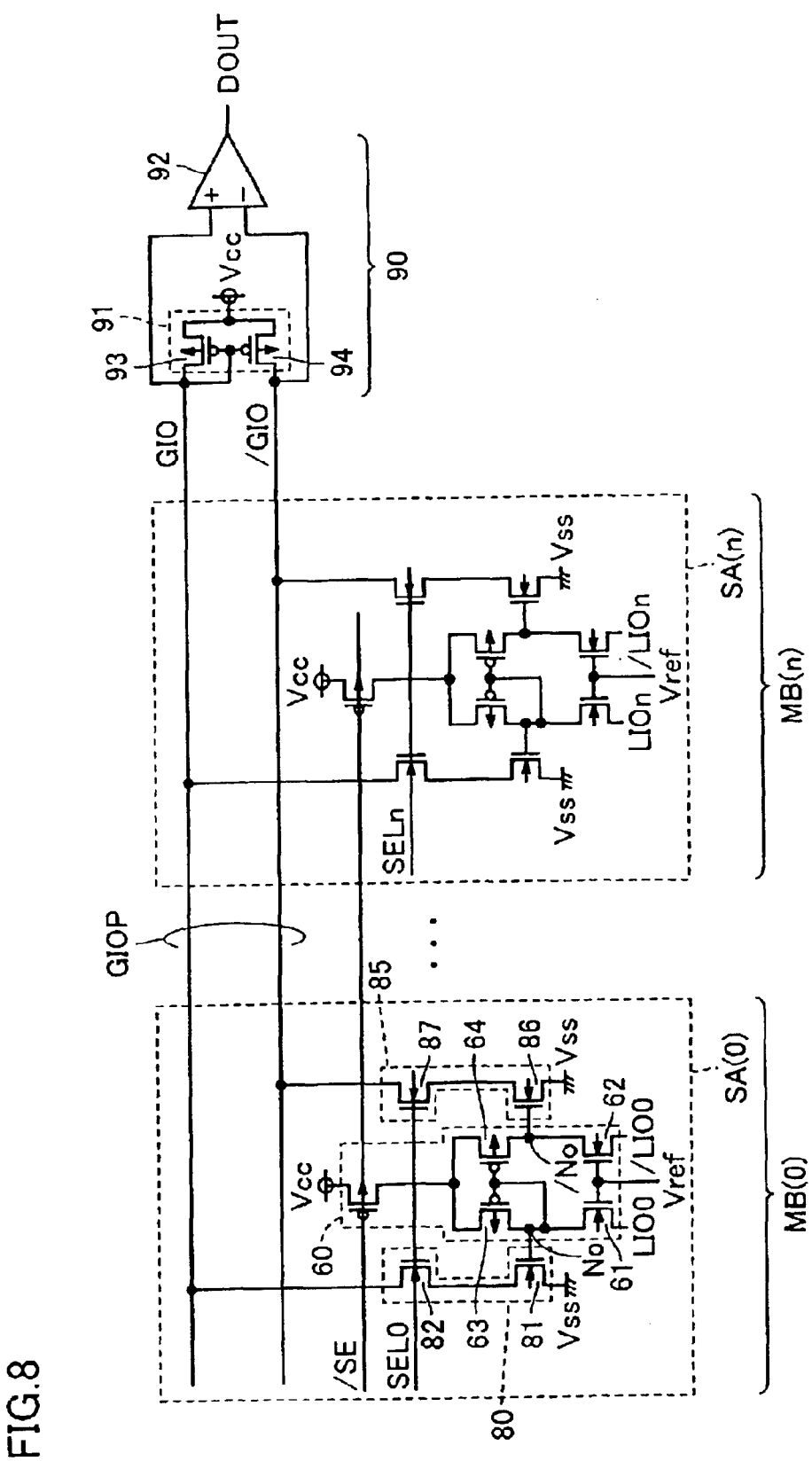
FIG. 8 is a circuit diagram showing a data read circuit system according to a second modification of the third embodiment.

Referring to FIG. 8, a structure of a second modification of the third embodiment differs from the structure of the first modification of the third embodiment shown in FIG. 7 in that data transmitting circuits 80 and 85 are arranged between ground voltage Vss and global data lines GIO and /GIO, respectively. In accordance with this, current mirror circuit 91 is arranged between power supply voltage Vcc and global data lines GIO and /GIO.

In the structure of the second modification of the third embodiment, data transmitting circuits 80 and 85 drive global data lines GIO and /GIO to ground voltage Vss, respectively. Therefore, each of transistors 81, 82, 86 and 87 is preferably formed of an N-channel MOS transistor. Transistors 93 and 94 forming current mirror circuit 91 are preferably formed of P-channel MOS transistors, respectively. Further, block select signals SEL0–SELn, which are activated to attain H-level in response to activation of the corresponding memory blocks, are employed instead of block select signals /SEL0–/SELn, respectively, and each can be supplied to the gates of transistors 82 and 87 in the corresponding sense amplifier SA. Structures and operations other than the above are substantially the same as those of the first modification of the third embodiment, and therefore, description thereof is not repeated.

According to the above structure, data reading can be executed similarly to the first modification of the third embodiment, although the polarity is inverted in the voltage amplification. In particular, data transmitting circuits 80 and 85 can be formed of N-channel MOS transistors, in which large source-drain currents can be easily used. Thereby, sizes of these transistors can be reduced.

A similar structure can be applied to the sense amplifier of the third embodiment shown in FIG. 6, whereby the transistor group forming data transmitting circuits 80 and 85 can be reduced in size.

Fourth Embodiment

A fourth embodiment will now be described in connection with a structure of a data read circuit system for memory array 10, in which the sense amplifiers in the third embodiment and the modification thereof are arranged for the memory cell columns, respectively.

Figure 9:
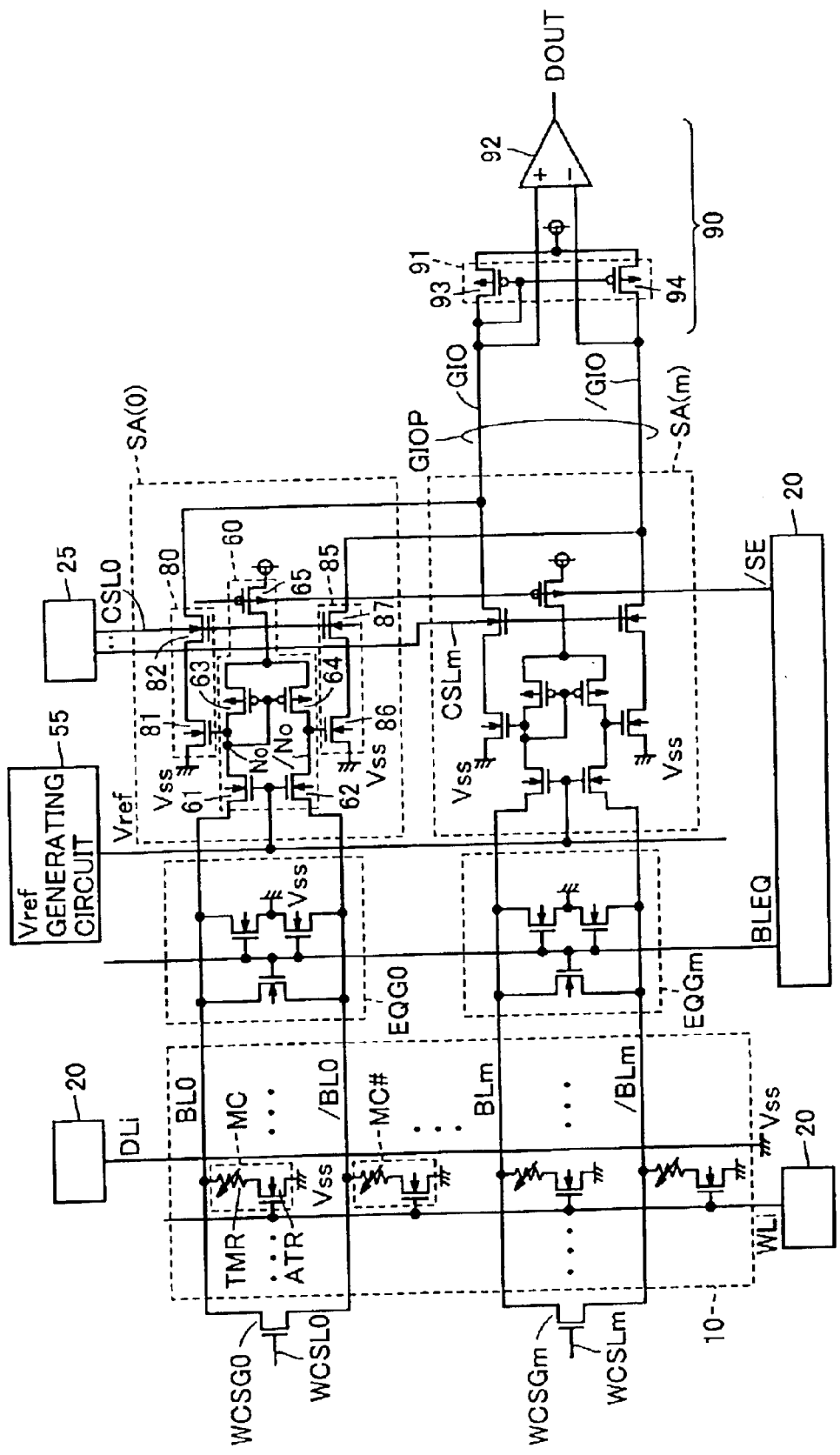
FIG. 9 is a circuit diagram showing structures of a memory array and a peripheral circuit according to a fourth embodiment.

In the structure according to the fourth embodiment shown in FIG. 9, memory array 10 as well as equalize circuit EQG and write column select gate WCSG provided for each memory cell column have the same structures as those in the first embodiment. Complementary global data lines GIO and /GIO forming global data line pair GIOP are provided for reading and writing data of one bit from and into memory array 10. Since main amplifier 90 has substantially the same structure as that of the third embodiment, description thereof is not repeated.

In the structure of the fourth embodiment, sense amplifiers SA(0)–SA(n) are provided corresponding to the memory cell columns, respectively. Each of sense amplifiers SA(0)–SA(n) has substantially the same structure as that in the second modification of the third embodiment, and therefore description thereof is not repeated.

In each memory cell column, differential amplifier 60 included in sense amplifier SA responds to the activation of sense enable signal /SE, and thereby supplies the passing currents of memory cell MC and reference cell MC# in the selected row through corresponding bit lines BL and /BL, respectively. Differential amplifier 60 amplifies current difference ΔI, which occurs between bit lines BL and /BL and has the polarity corresponding to the storage data of selected memory cell MC, to produce voltage difference ΔV between nodes No and /No. In this manner, the data read operation starts in parallel in the respective memory cell columns.

In each sense amplifier SA, data transmitting circuits 80 and 85 operate in response to activation (H-level) of corresponding column select line CSL, and thereby produces a current difference, which corresponds to voltage difference ΔV between corresponding nodes No and /No, between global data lines GIO and /GIO. Thus, in the selected column including active column select line at H-level, voltage difference ΔV occurring between nodes No and /No of differential amplifier 60 is differentially amplified by current mirror circuit 91 and data transmitting circuits 80 and 85 to produce the voltage difference between global data lines GIO and /GIO. Differential amplifier 92 further amplifies the voltage difference between global data lines GIO and /GIO to produce read data DOUT read from memory array 10.

Owing to the above structure, read data of multiple bits can be read continuously and rapidly by successively changing the selected columns after the data reading starts in parallel in the respective memory cell columns. In particular, each differential amplifier 60 directly drives bit line pair BLP so that the data read operation can be performed further rapidly.

Further, global data lines GIO and /GIO are arranged in the same direction as bit lines BL and /BL so that the MRAM device can have a structure suitable to parallel output of multiple bits.

Modification of Fourth Embodiment

Figure 10:
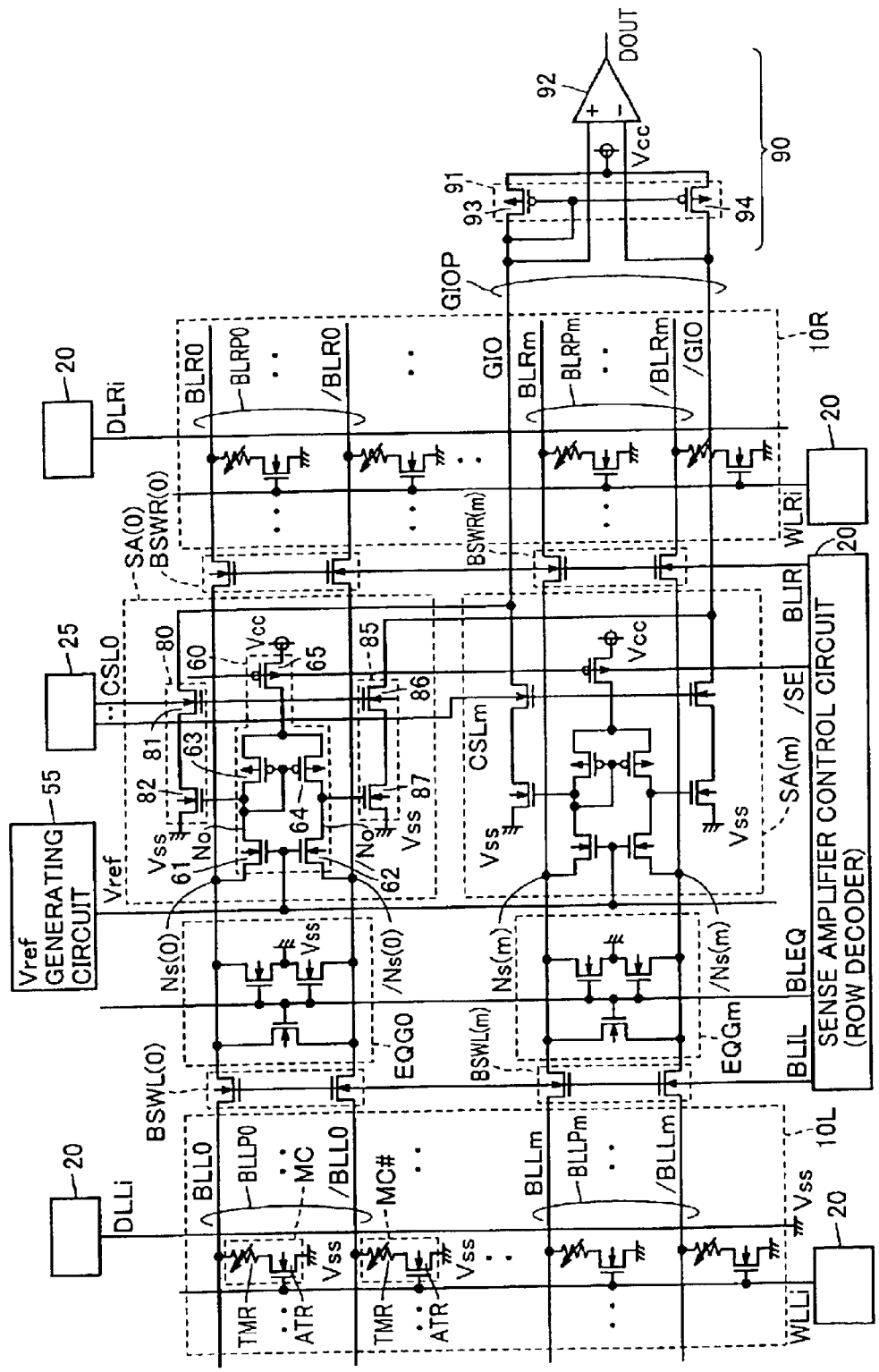
FIG. 10 is a circuit diagram showing structures of a memory array and a peripheral circuit according to a modification of the fourth embodiment.

Referring to FIG. 10, a structure according to a modification of the fourth embodiment differs from the structure according to the fourth embodiment in that a so-called "shared sense structure" is employed.

Memory array 10 is divided into left and right regions 10L and 10R located on the opposite sides of a region, where sense amplifiers SA(0)–SA(m) are arranged. Each of left and right regions 10L and 10R has substantially the same structure as memory array 10 already described. In the following description, left and right regions 10L and 10R may also be referred to as "memory array 10L" and "memory array 10R", respectively.

In FIG. 10, for discriminating the signal lines arranged in memory array 10L from those in memory array 10R, the word line, digit line and bit line arranged in memory array 10L are indicated by WLL, DLL and BLL (or /BLL), respectively, and the word line, digit line and bit line arranged in memory array 10R are indicated by WLR, DLR and BLR (or /BLR), respectively. Although not shown, write column select gate WCSG shown in FIG. 2 is arranged for each memory cell column in each of memory arrays 10L and 10R.

Each of sense amplifiers SA(0)–SA(m) is shared by memory arrays 10L and 10R, and amplifies the passing current difference between corresponding one of sense nodes Ns(0)–Ns(m) and corresponding one of sense nodes /Ns(0)–/Ns(m) to produce a voltage difference between corresponding nodes No and /No. In the following description, sense nodes Ns(0)–Ns(m) may be collectively referred to as "sense nodes Ns", and sense nodes /Ns(0)–/Ns(m) may be collectively referred to as "sense nodes /Ns".

Bit line connection switches BSWL(0) and BSWR(0)–BSWL(m) and BSWR(m) are arranged corresponding to the respective memory cell columns for connecting corresponding sense nodes Ns and /Ns to memory array 10R and 10L. In the following description, bit line connection switches BSWL(0)–BSWL(m) may be collectively referred to as "bit line connection switches BSWL", and bit line connection switches BSWR(0)–BSWR(m) may be collectively referred to as "bit line connection switches BSWR".

For example, bit line connection switch BSWL(0) connects bit lines BLL0 and /BLL0 to sense nodes Ns(0) and /Ns(0) in response to activation of a control signal BLIL, respectively. Similarly, bit line connection switch BSWR(0) connects bit lines BLR0 and /BLR0 to sense nodes Ns(0) and /Ns(0) in response to activation of a control signal BLIR, respectively.

Bit line connection switches BSWL and BSWR provided for the other memory cell columns operate similarly. While control signal BLIL is active, sense nodes Ns(0) and /Ns(0)–Ns(m) and /Ns(m) are therefore connected to bit lines BLL0 and /BLL0–BLLm and /BLLm, respectively. Conversely, sense nodes Ns(0) and /Ns(0)–Ns(m) and /Ns(m) are connected to bit lines BLR0 and /BLR0–BLRm and /BLRm, respectively, while control signal BLIR is active.

Equalize circuits EQG0–EQGm provided for the respective memory cell columns perform the equalize/precharge operations in response to activation of bit line equalize signal BLEQ. For example, equalize circuit EQG0 sets each of sense nodes Ns(0) and /Ns(0) to ground voltage Vss in response to bit line equalize signal BLEQ. In this manner, each of sense nodes Ns(0) and /Ns(0)–Ns(m) and /Ns(m) is set to ground voltage Vss in response to activation of bit line equalize signal BLEQ.

For reading the data, bit line equalize signal BLEQ changes from H-level to L-level, and each of sense nodes Ns(0) and /Ns(0)–Ns(m) and /Ns(m) is disconnected from ground voltage Vss. Further, only one of control signals BLIL and BLIR is activated to attain H-level. Thereby, bit lines BL and /BL arranged in unselected memory array 10L or 10R are electrically disconnected from corresponding sense nodes Ns and /Ns.

Consequently, each of sense amplifiers SA(0)–SA(m) executes the data read operation similar to that in the fourth embodiment based on the current difference occurring between the bit lines, which are connected to corresponding sense nodes Ns and /Ns, respectively, in the selected memory array.

According to the structure of the modification of the fourth embodiment, sense amplifier SA is arranged based on the shared sense structure. Therefore, substantial lengths of the bit lines in the data read operation can be suppressed, and data reading can be performed further rapidly.

Fifth Embodiment

A fifth embodiment will now be described in connection with a structure of a differential amplifier, which operates stably, and can be used instead of differential amplifiers 60 and 60' used in the first to fourth embodiments and the modifications thereof.

Figure 11:
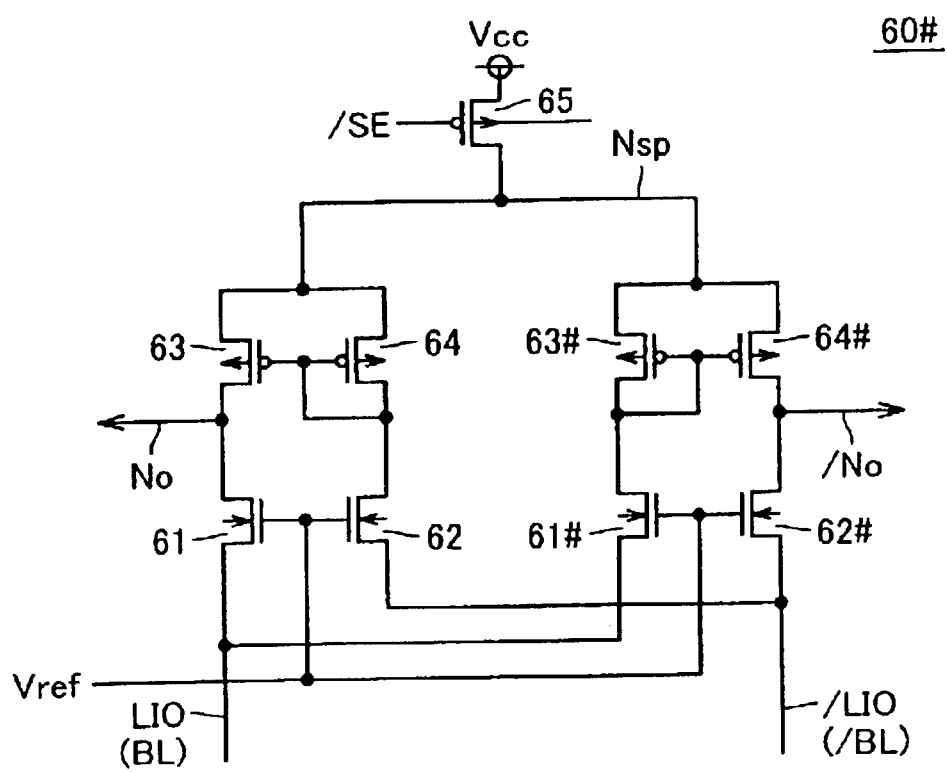
FIG. 11 is a circuit diagram showing a structure of a differential amplifier according to a fifth embodiment.

Referring to FIG. 11, a differential amplifier 60# according to the fifth embodiment includes N-channel MOS transistors 61 and 63 connected in series between data line LIO (or bit line BL) and node Nsp as well as N-channel MOS transistors 61# and 63# connected in parallel to transistors 61 and 63. Further, differential amplifier 60# includes P-channel MOS transistors 62 and 64 connected in series between data line /LIO (or bit line /BL) and node Nsp as well as P-channel MOS transistors 62# and 64# connected in parallel to transistors 62 and 64.

Each of gates of transistors 63 and 64 are connected to a connection node between transistors 62 and 64, and each of gates of transistors 63# and 64# is connected to a connection node between transistors 61# and 63#. Each of transistors 61, 62, 61# and 62# receives reference voltage Vref on its gate.

Differential amplifier 60# further has P-channel MOS transistor 65 electrically coupled between power supply voltage Vcc and node Nsp. Transistor 65 receives sense enable signal /SE on its gate. Transistor 65 may be eliminated, as is done in differential amplifier 60' shown in FIG. 4.

Owing to the above structure, differential amplifier 60# can keep balance between load capacitances of nodes No and /No. For example, in differential amplifiers 60 and 60', balance is not kept between the load capacitances of nodes No and /No. In such structures, a time (sense time) required for producing sufficient voltage difference ΔV between nodes No and /No changes depending on the level of the read data. However, differential amplifier 60# formed of the complementary structure can keep the constant sense time independently of the level of the read data. Further, the DC gain in the differential amplifier operation can be large so that the data read operation can be stable.

The data read circuit systems in the first to fourth embodiments and the modifications thereof shown in FIGS. 2, 4, 6, 7, 8, 9 and 10 may employ either of differential amplifiers 60' and 60#.

In the fourth embodiments and the modifications thereof, the data read operation is necessarily performed with the complementary data lines. However, the structure of memory array 10 is not restricted to the arrangement of memory cells for storing one bit by two MTJ memory cells as already described.

Figure 12A:
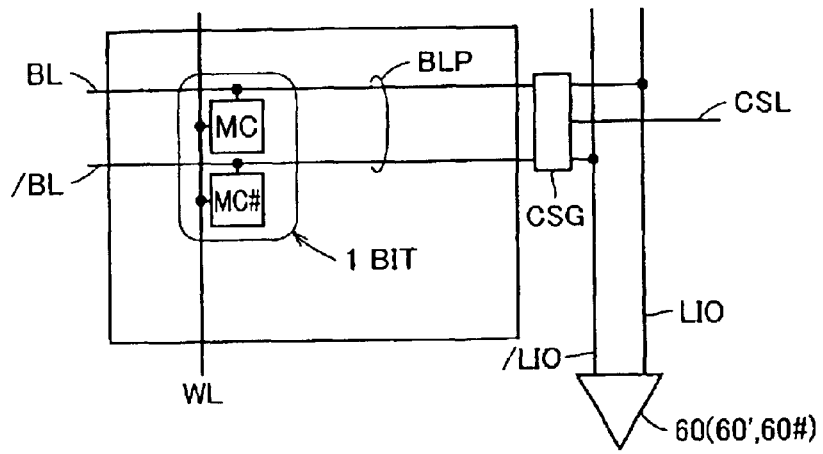
FIGS. 12A, 12B and 12C conceptually show variations of an array structure for performing data reading with complementary data lines.
Figure 12B:
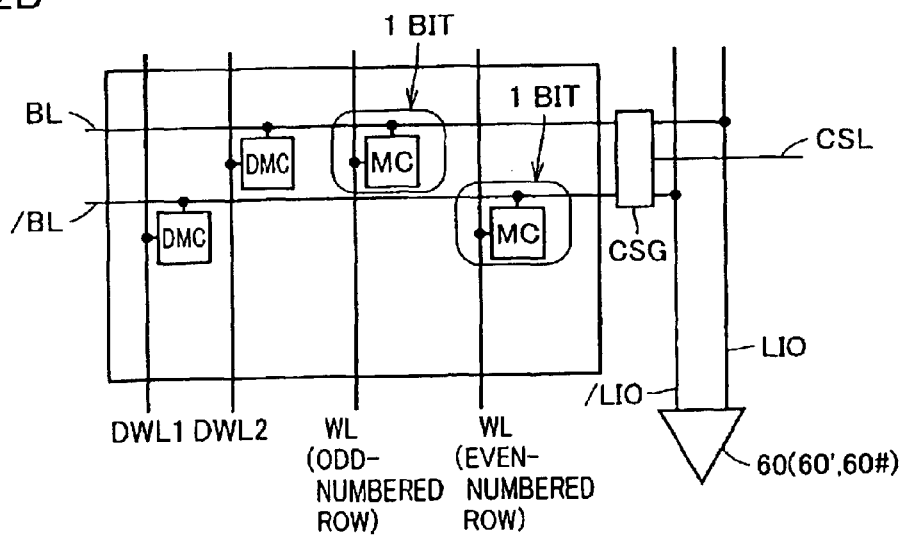
Figure 12C:
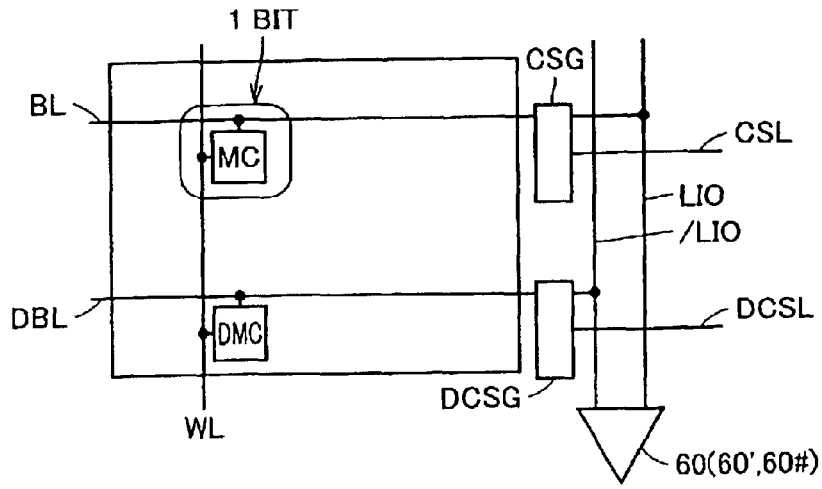

With reference to FIGS. 12A–12C, description will now be given on variations of the array structure for performing the data reading with complementary data lines.

FIG. 12A shows a memory cell arrangement for storing one bit by two MTJ memory cells, as is done in the first to fourth embodiments and the modifications thereof. In this arrangement, two memory cells MC and MC# corresponding to the same address are connected to complementary data lines LIO (BL) and /LIO (/BL) for performing the data reading based on the passing current difference between the complementary data lines, respectively.

The memory cell arrangement shown in FIG. 12A requires the MTJ memory cells, which are equal in number to double the storage bits, but executes the data reading in accordance with the passing current difference between the MTJ memory cells, which actually store the complementary data. Therefore, the data reading can be performed accurately by following variations in manufacturing characteristics of the tunneling magneto-resistance elements.

FIGS. 12B and 12C show memory cell arrangements using dummy memory cells having an intermediate electric resistance. A dummy memory cell DMC has an electric resistance Rm intermediate between electric resistances Rmax and Rmin corresponding to two kinds of storage data levels ("1" and "0") of memory cell MC, respectively. Preferably, resistance Rm is designed to be equal to (Rmin+ ΔR/2), where ΔR is equal to (Rmax–Rmin). Usually, dummy memory cell DMC is designed to include tunneling magneto-resistance element TMR, similarly to regular MTJ memory cell MC.

In the structure employing dummy memory cell DMC, data of one bit is stored by only one MTJ memory cell so that the required memory cells can be reduced in number.

FIG. 12B shows an example of the arrangement, in which dummy memory cells DMC form dummy rows.

In this arrangement, memory cell MC in each memory cell row is connected to either bit line BL or /BL. For example, memory cells MC are arranged alternately so that memory cell MC in an odd-numbered row is connected to bit line BL, and memory cell MC in an even-numbered row is connected to bit line /BL.

Although not shown specifically in FIG. 12B, dummy memory cells DMC are arranged in two dummy rows, and share the memory cell column with regular memory cells MC. Further, dummy word lines DWL1 and DWL2 are arranged corresponding to the dummy rows, respectively. Dummy memory cell DMC in each dummy row is connected to one of bit lines BL and /BL.

According to the above arrangement, word lines WL and dummy word lines DWL1 and DWL2 are selectively activated so that selected memory cell MC and dummy memory cell DMC can be connected to complementary data lines LIO (BL) and ILIO (/BL), or to complementary data lines /LIO (/BL) and LIO (BL), respectively, so that data reading can be performed based on the passing current difference between the complementary data lines.

As shown in FIG. 12C, dummy memory cells DMC are arranged to form a dummy column. Dummy memory cell DMC is arranged to share the memory cell row with regular memory cell MC, and a dummy bit line DBL is arranged corresponding to the dummy column. Data lines LIO and /LIO are connected to the bit line in the selected column and dummy bit line DBL, respectively.

By selectively activating word line WL in the above arrangement, selected memory cell MC and dummy memory cell DMC can be connected to complementary data line LIO (BL) and /LIO (DBL), respectively, so that data reading can be performed based on the passing current difference between complementary data lines.

Although the above structure employs dummy memory cell DMC, and stores data of one bit by one MTJ memory cell, this structure can execute data reading similarly to such structures that dummy memory cell DMC is employed instead of reference cell MC#, as a comparison target of the selected memory cell, in the data read circuit systems according to any one of the first to fifth embodiments and the modifications thereof.

Sixth Embodiment

A sixth embodiment will now be described in connection with a structure of a data read circuit system necessarily employing a reference cell having an intermediate electric resistance, i.e., dummy memory cell DMC shown in FIGS. 12B and 12C.

Figure 13:
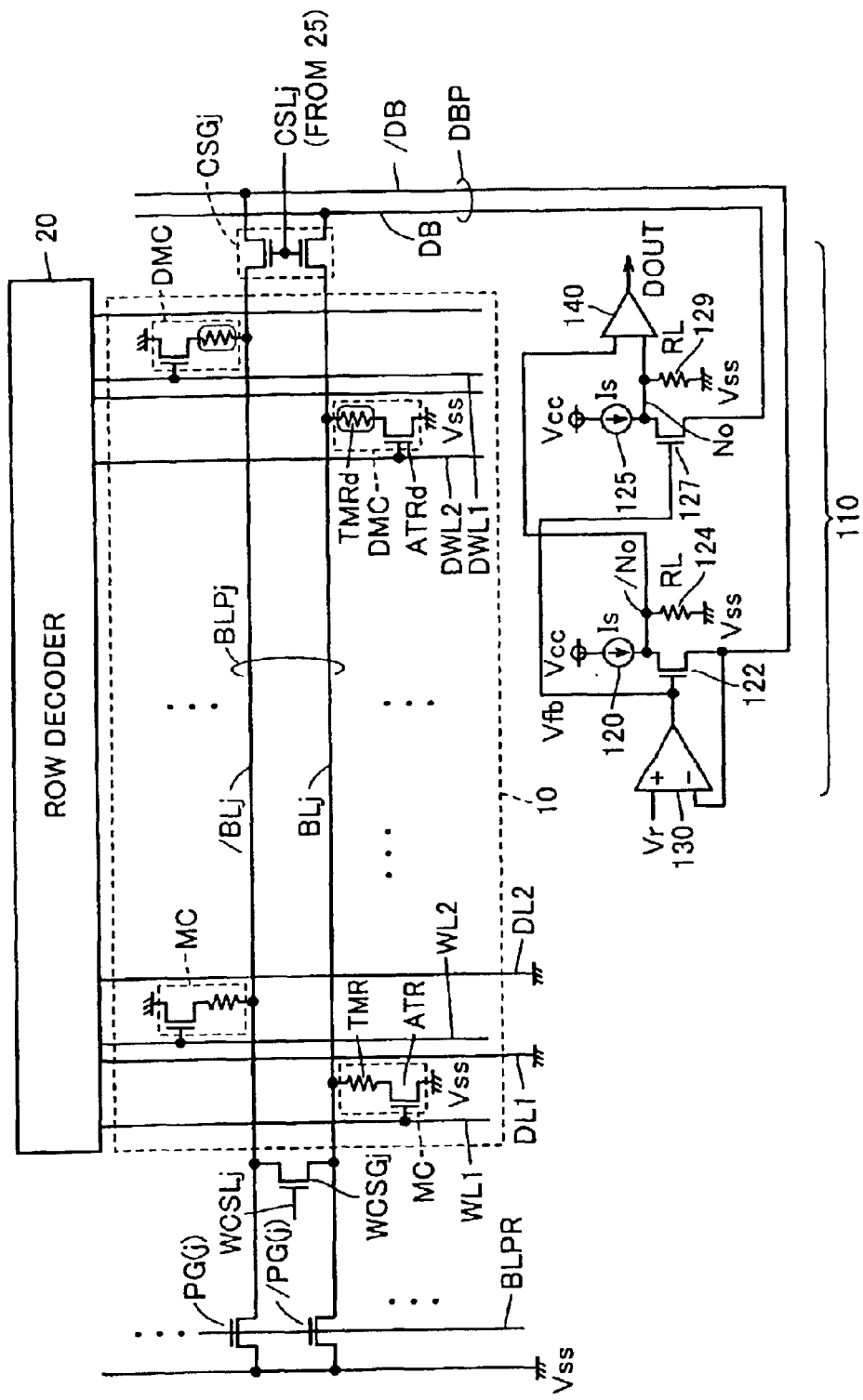
FIG. 13 is a circuit diagram showing a structure of a data read circuit system according to a sixth embodiment.

In a structure of the sixth embodiment shown in FIG. 13, memory array 10 is provided with memory cells MC and dummy memory cells DMC, similarly to FIG. 12B. Dummy memory cells DMC are arranged in two rows, and share the memory cell columns with regular memory cells MC.

For each memory cell column, bit line pair BLP formed of complementary bit lines BL and /BL is arranged. Precharge gates PG and /PG are arranged corresponding to bit lines BL and /BL, respectively. Each of precharge gates PG and /PG couples one end portion of corresponding bit line BL or /BL to ground voltage Vss in response to a bit line precharge signal BLPR.

Memory cells MC are arranged in a staggered fashion so that memory cells MC in the odd-numbered rows are connected to bit lines BL, and memory cells MC in the even-numbered rows are connected to bit lines /BL. Each memory cell MC has tunneling magneto-resistance element TMR and access element (access transistor) ATR connected between corresponding bit line BL or /BL and ground voltage Vss. Access transistor ATR is turned on in response to activation of corresponding word line WL.

Dummy word lines DWL1 and DWL2 are arranged corresponding to the rows of dummy memory cells, respectively. A dummy memory cell group corresponding to dummy word line DWL1 includes dummy magneto-resistance elements TMRd and dummy access elements (access transistors) ATRd connected between corresponding bit lines /BL and ground voltage Vss. Dummy access element ATRd is turned on in response to dummy word line DWL1, which becomes active when the odd-numbered row is selected.

The dummy memory cell group corresponding to dummy word line DWL2 includes dummy magneto-resistance elements TMRd and dummy access elements (access transistors) ATRd connected between corresponding bit lines BL and ground voltage Vss. Dummy access element ATRd is turned on in response to dummy word line DWL2, which becomes active when the even-numbered row is selected.

Each dummy memory cell DMC has electric resistance Rm equal to (Rmin+($\Delta$R/2)). For example, dummy magneto-resistance element TMRd is formed of tunneling magneto-resistance element TMR, which stores data corresponding to electric resistance Rmin and is similar to memory cell MC, and the on resistance of dummy access element ATRd is set to be larger by $\Delta$R/2 than that of access transistor ATR. In this manner, dummy memory cell DMC is formed. Alternatively, dummy access element ATRd and access transistor ATR may be designed to have similar on resistances, and dummy magneto-resistance element TMRd may be connected in series to tunneling magneto-resistance element TMR storing the data corresponding to electric resistance Rmin and a fixed resistance of an electric resistance of $\Delta$R/2. In this manner, dummy memory cell DMC can also be formed.

FIG. 13 representatively shows word lines WL1 and WL2, and digit lines DL1 and DL2, which correspond to the first and second memory cell columns, and bit lines BLj and /BLj corresponding to the memory cell column in the jth position, as well as corresponding memory cells MC and corresponding dummy memory cells DMC.

The structure according to the sixth embodiment is further provided with column select gates CSG arranged corresponding to the respective memory cell columns, and complementary data buses DB and /DB neighboring to memory array 10. Data buses DB and /DB form data bus pair DBP.

Column select gate CSG is connected between ends on the other side of bit lines BL and /BL and data buses DB and /DB, and is turned on in response to activation of corresponding column select line CSL. For example, column select gate CSGj connects the ends on the other side of corresponding bit lines BL and /BL to data buses DB and /DB in response to activation of column select line CSLj, respectively.

A data read circuit 110 in the sixth embodiment includes a current source 120 arranged between power supply voltage Vcc and node /No for supplying constant current Is to node /No, a transistor 122 electrically coupled between node /No and data bus /DB, and a current detecting resistance 124 connected between node /No and ground voltage Vss.

Data read circuit 110 further includes a current source 125 arranged between power supply voltage Vcc and node No for supplying constant current Is to node No, a transistor 127 electrically coupled between node No and data bus DB, and a current detection resistance 129 connected between node No and ground voltage Vss. Current resistances 124 and 129 have the electric resistances of the same value RL.

Data read circuit 110 further includes a voltage amplifier 130 which amplifies a voltage difference between one of data buses DB and /DB and a predetermined reference voltage Vr to produce a feedback voltage Vfb, and a voltage amplifier 140 which amplifies a voltage difference between nodes No and /No to produce read data DOUT. FIG. 13 shows by way of example a circuit structure, in which an input side of voltage amplifier 130 is connected to data bus /DB. However, the other data bus DB may be arranged on the input side of voltage amplifier 130. Feedback voltage Vfb produced from voltage amplifier 130 is applied to each of gates of transistors 122 and 127. Reference voltage Vr is set similarly to reference voltage Vref in the first embodiment.

Before the data reading, each word line WL is inactive so that bit lines BL and /BL are disconnected from memory cell MC and dummy memory cell DMC. Since bit line precharge signal BLPR is active, bit lines BL and /BL are precharged to ground voltage Vss.

Since each column select line CSL is inactive, data buses DB and /DB are disconnected from bit lines BL and /BL. Therefore, the data line voltage clamping portion formed of voltage amplifier 130 and transistors 122 and 127 clamps each of data buses DB and /DB at predetermined voltage Vr prior to the data reading.

During the data reading, bit line precharge signal BLPR is inactive, and bit lines BL and /BL are disconnected from ground voltage Vss. Further, the word line in the selected row, the column select line in the selected column and one of dummy word lines DWL1 and DWL2 are activated in accordance with the address selection.

In accordance with the above operations, data bus DB and bit line BL in the selected column are connected between power supply voltage Vcc and ground voltage Vss via one of selected memory cell MC and dummy memory cell DMC. Similarly, data bus /DB and bit line /BL in the selected column are connected between power supply voltage Vcc and ground voltage Vss via the other of selected memory cell MC and dummy memory cell DMC.

During the data reading, the data line voltage clamping portion formed of voltage amplifier 130 and transistors 122 and 127 clamps each of data buses DB and /DB at predetermined voltage Vr, similarly to the state before the data reading. In particular, when data bus /DB is connected to dummy memory cell DMC, data buses DB and /DB can be clamped based on the passing current of dummy memory cell DMC.

Accordingly, data read circuit 110 produces a current difference, which corresponds to an electric resistance difference ($\Delta R/2$) between selected memory cell MC and dummy memory cell DMC, between the passing currents on data buses DB and /DB while keeping such a state that data buses DB and /DB and bit lines BL and /BL in the selected column are clamped at the above predetermined voltage.

In accordance with the passing current difference between data buses DB and /DB, a passing current difference occurs between current detection resistances 124 and 129 having the same electric resistance RL. In accordance with this, the voltage difference corresponding to the storage data of selected memory cell MC occurs between nodes No and /No. Consequently, voltage amplifier 130 can produce read data DOUT reflecting the level of storage data of selected memory cell MC.

Even when data bus DB is connected to dummy memory cell DMC, a similar data read operation based on the passing current difference between selected memory cell MC and dummy memory cell DMC can be executed without changing connection of the input side of voltage amplifier 130 to data buses DB and /DB. However, if it is desired to execute clamping of voltages on data buses DB and /DB restrictedly based on the passing current of dummy memory cell DMC, such a structure may be employed that the connection of the input side of voltage amplifier 130 to data buses DB and /DB can be changed in accordance with selection of dummy word lines DWL1 and DWL2.

According to the structure of the sixth embodiment, as described above, the data read operation can be executed while basically clamping the voltages on data buses DB and /DB and bit lines BL and /BL in the selected column at the constant level. Therefore, the data reading can be performed fast without charging and discharging these data lines having relatively large parasitic capacitances.

In particular, even before the data reading, data buses DB and /DB having large parasitic capacities are clamped at a predetermined voltage similar to that during the data reading. Therefore, charging and discharging of data buses DB and /DB are not required even at the start of data reading. Consequently, the data read operation can be performed further fast.

The operation of clamping the voltages on data buses DB and /DB can be executed based on the passing current of dummy memory cell DMC, i.e., an actual electric resistance. Therefore, a data read operation point, at which the voltage exhibits the maximum amplitude, can be ensured while following variations in electric resistance characteristics of the MTJ memory cells caused by variations in manufacturing process.

Modification of Sixth Embodiment

In the structure of the sixth embodiment described above, reference cells (dummy memory cells) are arranged in rows and columns within the same array as the regular MTJ memory cells. However, the reference cells may be arranged outside the memory array, and a modification of the sixth embodiment will now be described in connection with a data read circuit system employed for such a structure.

Figure 14:
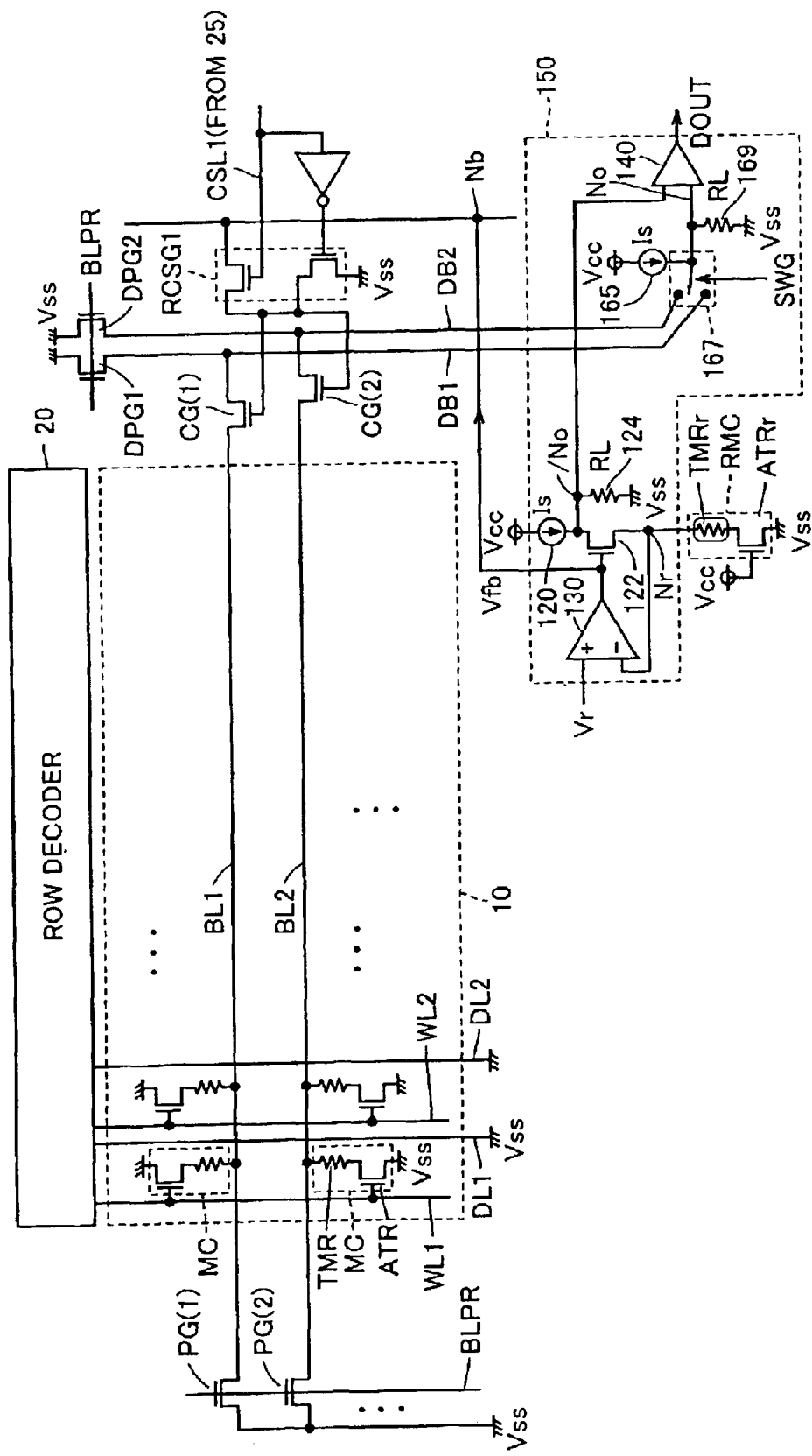
FIG. 14 is a circuit diagram showing a structure of a data read circuit system according to a modification of the sixth embodiment.

FIG. 14 is a circuit diagram showing a structure of the data read circuit system according to the modification of the sixth embodiment.

Referring to FIG. 14, the structure according to the modification of the sixth embodiment has memory array 10, in which regular memory cells MC for executing the data storage are arranged in rows and columns.

Bit lines BL are arranged corresponding to memory cell columns, respectively. Precharge gates PG are arranged corresponding to bit lines BL, respectively. Each precharge gate PG couples one end portion of corresponding bit line BL to ground voltage Vss in response to bit line precharge signal BLPR. Memory cells MC are arranged corresponding to crossings between word lines WL and bit lines BL, respectively. FIG. 14 representatively shows four memory cell columns corresponding to the first and second memory cell rows and first and second memory cell columns, and also shows signal line groups corresponding to them.

The structure according to the modification of the sixth embodiment is provided with two data buses DB1 and DB2. Precharge gates DPG1 and DPG2 are arranged corresponding to data buses DB1 and DB2, respectively. Precharge gates DPG1 and DPG2 precharge data buses DB1 and DB2 to ground voltage Vss in response to bit line precharge signal BLPR, respectively.

Column select lines CSL are employed based on the number of data buses DBB, and each are arranged for two memory cell columns. For example, column select line CSL1 shown in FIG. 14 is arranged commonly to the first and second memory cell columns, and is activated to attain H-level when the first or second memory cell column is selected.

Column select gates CG(1), CG(2), . . . , which are provided corresponding to the memory cell columns, respectively, electrically couple the ends on the other side of the bit lines in the odd-numbered column to data bus DB1, and electrically couple the ends on the other side of the bit lines in the even-numbered columns to data bus DB2. For example, bit line BL1 is electrically coupled to data bus DB1 via column select gate CG(1), and bit line BL2 is electrically coupled to data bus DB2 via column select gate CG(2). Each of column select gates CG(1), CG(2), . . . is formed of, e.g., an N-channel MOS transistor. In the following description, column select gates CG(1), CG(2), . . . may be collectively referred to as "column select gates CG".

A read select gate RCSG is arranged for each group of the memory cell columns sharing the same column select line CSL. Read select gate RCSG connects the gate of column select gate CG to a node Nb when corresponding column select line is activated. For example, in response to the activation of column select line CSL1, read select gate RCSG1 connects each of gates of column select gates CG(1) and CG(2) to node Nb.

When corresponding column select line is inactive, read select gate RCSG connects the gate of corresponding column select gate CG to ground voltage Vss. Thereby, each of column select gates CG corresponding to the unselected column select line is turned off.

A replica memory cell RMC, which is arranged as a reference cell outside memory array 10, is connected between a reference node Nr and ground voltage Vss. Replica memory cell RMC has an electric resistance Rm similar to that of dummy memory cell DMC shown in FIG. 13, and includes a replica magneto-resistance element TMRr and a replica access element ATRr connected together in series. Replica magneto-resistance element TMRr and replica access element ATRr are designed similarly to dummy magneto-resistance element TMRd and dummy access element ATRd in dummy memory cell DMC, respectively. The gate of replica access element ATRr is fixed to power supply voltage Vcc, and is always on.

A data read circuit 150 according to the modification of the sixth embodiment includes current source 120, current detecting resistance 124 and voltage amplifiers 130 and 140. Voltage amplifier 130 amplifies the voltage difference between predetermined reference voltage Vr and reference node Nr, which is coupled to ground voltage Vss via replica memory cell RMC, and supplies negative feedback voltage Vfb to node Nb. Transistor 122 is electrically coupled between reference node Nr and node No, and receives feedback voltage Vfb on its gate.

Data read circuit 150 further includes a current source 165 arranged between power supply voltage Vcc and node No for supplying constant current Is to node /No, a select switch 167 for selectively connecting data buses DB1 and DB2 to node No, and a current detection resistance 169 connected between node No and ground voltage Vss. Current detection resistances 124 and 169 have electric resistances set to the same value RL.

Select switch 167 connects one of data buses DB1 and DB2, which is coupled to the selected memory cell, to node No in response to a control signal SWG. For example, control signal SWG can be formed of one one-bit signal indicating whether the selected memory cell belong to an even-numbered column or an odd-numbered column.

Before the data reading, each word line WL and each column select line are inactive, and bit line precharge signal BLPR is active. Therefore, each bit line BL is disconnected from memory cell MC, and is precharged to ground voltage Vss. Data buses DB and /DB are precharged to ground voltage Vss.

In the data read operation, bit line precharge signal BLPR is inactivated, and each of bit lines BL and /BL and each of data buses DB1 and DB2 are disconnected from ground voltage Vss. Further, in accordance with the address selection, the word line in the selected row and the column select line in the selected column are selectively activated. Select switch 167 connects one of data buses DB1 and DB2 to node No.

In accordance with this, the MOS transistor forming column select gate CG in the selected column is supplied on its gate with feedback voltage Vfb for clamping reference node Nr at reference voltage Vr, similarly to transistor 122. Thus, the data line voltage clamping portion, which is formed of voltage amplifier 130, transistor 122 and column select gate CG in the selected column, clamps the bit line in the selected column at predetermined voltage Vr based on the passing current of replica memory cell RMC.

In accordance with this, selected data bus DB1 or DB2 as well as bit line BL in the selected column are electrically coupled between power supply voltage Vcc and ground voltage Vss via selected memory cell MC. Likewise, the reference node is electrically coupled between power supply voltage Vcc and ground voltage Vss via replica memory cell RMC.

Therefore, data read circuit 110 produces a current difference, which corresponds to the electric resistance difference ($\Delta R/2$) between selected memory cell MC and replica memory cell RMC, between the passing currents of the selected data bus and reference node Nr while keeping such a state that reference node Nr and bit line BL in the selected column are clamped at the predetermined voltage described above.

In accordance with the above operation, current detection resistances 124 and 169 having the same electric resistance RL produces the voltage difference corresponding to the storage data of selected memory cell MC between nodes No and /No. As a result, voltage amplifier 130 can produce read data DOUT similarly to the sixth embodiment.

Owing to the above structures, data reading can be performed fast and accurately, similarly to the data read operation according to the sixth embodiment. Since dummy memory cells DMC arranged in rows and columns can be replaced with only one replica memory cell RMC, an area of memory array 10 can be smaller than that in the structure according to the sixth embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device comprising:
   a plurality of memory cells having an electric resistance according to magnetically written storage data;
   first and second data lines complementary to each other; and
   a differential amplifier portion for performing data reading according to a difference between passing currents of said first and second data lines, wherein
   said first and second data lines are electrically coupled, in a data read operation, to a fixed voltage via a selected memory cell among said plurality of memory cells and a reference cell provided as a comparison target of said selected memory cell, respectively; and
   said differential amplifier portion includes:
   a current supply circuit arranged between a power supply voltage and first and second nodes for supplying the same operation current to said first and second nodes at least in said data read operation, and
   a current amplifier circuit for electrically coupling said first and second nodes to said first and second data lines, respectively, and converting a passing current difference occurring between said first and second data lines into a voltage difference between said first and second nodes so that each of said first and second data lines may be clamped at a predetermined voltage not exceeding a reference voltage.

2. The thin film magnetic memory device according to claim 1, wherein said differential amplifier portion further includes a current supply transistor electrically coupled between said power supply voltage and an internal node, and being turned on to supply said operation current in the data read operation;

said current supply circuit has first and second transistors electrically coupled between said internal node and said first and second nodes, respectively, and each having a gate connected to said first node; and said current amplifier circuit has:
a third transistor electrically coupled between said first node and said first data line and receiving said reference voltage on its gate, and
a fourth transistor electrically coupled between said second node and said second data line and receiving said reference voltage on its gate.

3. The thin film magnetic memory device according to claim 2, wherein said reference voltage is lower than said power supply voltage.

4. The thin film magnetic memory device according to claim 1, wherein said current supply circuit supplies said operation current to said first and second nodes even before the data reading.

5. The thin film magnetic memory device according to claim 4, wherein said current supply circuit has first and second transistors electrically coupled between said power supply voltage and said first and second nodes, respectively, and each having a gate connected to said first node; and said current amplifier circuit has:
a third transistor electrically coupled between said first node and said first data line and receiving said reference voltage on its gate, and
a fourth transistor electrically coupled between said second node and said second data line and receiving said reference voltage on its gate.

6. The thin film magnetic memory device according to claim 1, wherein said fixed voltage corresponds to ground voltage; and
said thin film magnetic memory device further comprises an equalize circuit for setting each of said first and second data lines to said ground voltage before the data reading.

7. The thin film magnetic memory device according to claim 1, wherein said plurality of memory cells are divided into a plurality of memory blocks;

said differential amplifier portion and said first and second data lines are provided for each of said memory blocks; and said thin film magnetic memory device further comprises:
first and second global data lines being complementary to each other and provided in common to said plurality of memory blocks,
a global current supply portion arranged between said first voltage and said first and second global data lines for supplying the same current to said first and second global data lines,
a plurality of first data transmitting circuits provided for said memory blocks, respectively, each for driving said first global data line to a second voltage with a current corresponding to a voltage on said first node in the corresponding differential amplifier portion,
a plurality of second data transmitting circuits provided for said memory blocks, respectively, each for driving said second global data line to said second voltage with a current corresponding to a voltage on said second node in the corresponding differential amplifier portion, and
a voltage amplifier for amplifying a voltage difference between said first and second global data lines to produce read data.

8. The thin film magnetic memory device according to claim 7, wherein each of said differential amplifier portions and each of said first and second data transmitting circuits operate when the corresponding memory block is selected.

9. The thin film magnetic memory device according to claim 7, wherein said differential amplifier portions in each of said memory blocks operate in parallel, and said first and second data transmitting circuits operate in one memory block successively selected from said plurality of memory blocks.

10. The thin film magnetic memory device according to claim 7, wherein said first and second voltages correspond to said power supply voltage and a ground voltage, respectively, each of said first data transmitting circuits has a first N-channel field-effect transistor electrically coupled between said first global data line and said ground voltage, and having a gate connected to the corresponding first node, and each of said second data transmitting circuits has a second N-channel field-effect transistor electrically coupled between said second global data line and said ground voltage, and having a gate connected to the corresponding second node.

11. The thin film magnetic memory device according to claim 1, wherein said plurality of memory cells are arranged in rows and columns;

said first and second data lines correspond to complementary bit lines arranged in each memory cell column;

said differential amplifier portion is arranged as a sense amplifier in each of said memory cell columns;

said thin film magnetic memory device further comprises:
first and second global data lines being complementary to each other and provided in common to said plurality of memory blocks,
a global current supply portion arranged between said first voltage and said first and second global data lines for supplying the same current to said first and second global data lines,
a plurality of first data transmitting circuits provided for said memory cell columns, respectively, each for driving said first global data line to a second voltage with a current corresponding to a voltage on said first node in the corresponding differential amplifier portion,
a plurality of second data transmitting circuits provided for said memory cell columns, respectively, each for driving said second global data line to said second voltage with a current corresponding to a voltage on said second node in the corresponding differential amplifier portion, and a voltage amplifier for amplifying a voltage difference between said first and second global data lines to produce read data.

12. The thin film magnetic memory device according to claim 11, wherein said plurality of memory cells are divided in the row direction into first and second regions, said differential amplifier portion is arranged between said first and second regions, and said thin film magnetic memory device further comprises connection switches provided for each of said memory cell columns, for electrically disconnecting, in one of said first and second regions, said first and second data lines from the corresponding first and second nodes, respectively.

13. The thin film magnetic memory device according to claim 11, further comprising:

column select lines arranged for said memory cell columns, respectively, for transmitting results of said column selection to the corresponding first and second data transmitting circuits, wherein said first and second data lines and said first and second global data lines are arranged in the column direction, and said column select line is arranged in the row direction.

14. The thin film magnetic memory device according to claim 1, wherein said current supply circuit has:
a first current mirror circuit for supplying said same current to said first node and a third node, and
a second current mirror circuit for supplying said same current to said second node and a fourth node; and said current amplifier circuit has:
a first converting circuit provided between said first and fourth node and said first data line, and for producing on said first node a voltage according to said passing current of said first data line, and
a second converting circuit provided between said second and third node and said second data line, and for producing on said second node a voltage according to said passing current of said second data line.

15. The thin film magnetic memory device according to claim 14, wherein said first current mirror circuit has first and second transistors electrically coupled between said power supply voltage and said first and third nodes, respectively, and each having a gate connected to said third node, said second current mirror circuit has third and fourth transistors electrically coupled between said power supply voltage and said second and fourth nodes, respectively, and each having a gate connected to said fourth node, said first converting circuit has fifth and sixth transistors electrically coupled between said first and fourth nodes and said first data line, respectively, and each receiving on its gate said reference voltage, and said second converting circuit has seventh and eighth transistors electrically coupled between said second and third nodes and said second data line, respectively, and each receiving on its gate said reference voltage.

16. A thin film magnetic memory device comprising:

a plurality of memory cells each having one of first and second electric resistances according to magnetically written storage data, a reference cell having an electric resistance intermediate between said first and second electric resistances, and being electrically coupled between first and second voltages at least in a data read operation;

a first data line electrically coupled between the first and second voltages via a selected memory cell corresponding to a selected address in the data read operation; and a data read circuit provided for performing data reading according to a difference between passing currents of said selected memory cell and said reference cell, wherein said data read circuit includes a data line voltage clamping portion for clamping said first data line at a predetermined voltage based on the passing current of said reference cell in said data read operation.

17. The thin film magnetic memory device according to claim 16, wherein said data line voltage clamping portion clamps said first data line at said predetermined voltage prior to said data reading.

18. The thin film magnetic memory device according to claim 16, further comprising:

a second data line for transmitting data complementary to said first data line, wherein said second data line is electrically coupled between said first and second voltages through said reference cell in said data read operation;

said data read circuit includes:
a first current supply portion arranged between said first voltage and first node for supplying a constant current to said first node, and
a second current supply portion arranged between said first voltage and second node for supplying said constant current to said second node;

said data line voltage clamping portion includes:
a first current control portion arranged between said first node and predetermined one data line of said first and second data lines for controlling a passing current of said one data line to clamp a voltage on said one data line at said predetermined voltage, and
a second current control portion arranged between said second node and the other data line of said first and second data lines for controlling a passing current of said the other data line to clamp a voltage on said one data line at said predetermined voltage; and said data read circuit further includes a voltage converting portion for converting a passing current difference between said first and second data lines into a voltage difference.

19. The thin film magnetic memory device according to claim 16, wherein said data read circuit further includes:
a first current supply portion arranged between said first voltage and first node for supplying a constant current to said first node, and
a second current supply portion arranged between said first voltage and second node for supplying said constant current to said second node;

said data line voltage clamping portion includes:
a reference node connected to said second voltage via said reference cell,
a first current control portion arranged between said first node and said reference node for controlling a passing current of said reference node to clamp a voltage on said reference node at said predetermined voltage, and a second current control portion arranged between said second node and said first data line for controlling a passing current of said first data line to clamp a voltage on said reference node at said predetermined voltage; and said data read circuit further includes a current difference detecting portion for converting a passing current difference between said first data line and said reference node into a voltage difference.

20. The thin film magnetic memory device according to claim 19, wherein said data line voltage clamping portion further has a voltage amplifier for producing a feedback voltage corresponding to a voltage difference between the voltage on said reference node and said predetermined voltage on a third node, said first current control portion has a first transistor electrically coupled between said first node and said reference node for receiving said feedback voltage on its gate, said second current control portion has a second transistor for electrically coupling said first data line to said selected memory cell in accordance with results of address selection, and said second transistor receives on its gate said feedback voltage.

* * * * *

UNITED STATES PATENT AND TRADEMARK OFFICE
CERTIFICATE OF CORRECTION

PATENT NO. : 6,738,285 B2
DATED : May 18, 2004
INVENTOR(S) : Hiroaki Tanizaki et al.

It is certified that error appears in the above-identified patent and that said Letters Patent is hereby corrected as shown below:

Title page,
Item [73], Assignee, add the following second assignee information:
-- Mitsubishi Electric Engineering Company Limited, Tokyo, (JP) --

Signed and Sealed this

Fourth Day of January, 2005

JON W. DUDAS
*Director of the United States Patent and Trademark Office*